(12) United States Patent
Yoo et al.

(10) Patent No.: US 11,793,055 B2
(45) Date of Patent: Oct. 17, 2023

(54) DISPLAY DEVICE

(71) Applicant: Samsung Display Co., Ltd., Yongin-Si (KR)

(72) Inventors: Byung Han Yoo, Suwon-si (KR); Kyoungwon Kwak, Asan-si (KR); Jihye Kim, Asan-si (KR); Kee Hyun Nam, Seoul (KR); Kijune Lee, Yongin-si (KR); Dae-Young Lee, Seoul (KR); Duk-Woon Choi, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/315,008

(22) Filed: May 7, 2021

(65) Prior Publication Data

US 2022/0069034 A1 Mar. 3, 2022

(30) Foreign Application Priority Data

Aug. 26, 2020 (KR) .................. 10-2020-0108005

(51) Int. Cl.
| | |
|---|---|
| *G09G 5/00* | (2006.01) |
| *H10K 59/65* | (2023.01) |
| *G06V 40/13* | (2022.01) |
| *H10K 50/858* | (2023.01) |
| *H10K 50/86* | (2023.01) |
| *H10K 59/38* | (2023.01) |
| *H10K 59/122* | (2023.01) |

(52) U.S. Cl.
CPC ......... *H10K 59/65* (2023.02); *G06V 40/1318* (2022.01); *H10K 50/858* (2023.02); *H10K 50/865* (2023.02); *H10K 59/122* (2023.02); *H10K 59/38* (2023.02)

(58) Field of Classification Search
CPC ............... H01L 27/3234; H01L 27/322; H01L 27/3246; H01L 27/3258; H01L 27/3253; H01L 51/5275; H01L 51/5293; H01L 51/5271; H01L 51/5284; H01L 51/5246; G06V 40/1318; G02F 1/133308; G02F 1/133502; G02F 1/1339; G02F 1/133528; G02F 1/1605; H10K 59/65; H10K 59/122; H10K 59/38
USPC ....................................................... 345/156
See application file for complete search history.

(56) References Cited

U.S. PATENT DOCUMENTS

| | | | |
|---|---|---|---|
| 10,719,172 B2 | 7/2020 | Han et al. | |
| 2015/0162391 A1* | 6/2015 | Kim | ............... H01L 27/3218 257/40 |

(Continued)

FOREIGN PATENT DOCUMENTS

| | | |
|---|---|---|
| KR | 10-2019-0028245 A | 3/2019 |
| KR | 10-2019-0092661 A | 8/2019 |

(Continued)

*Primary Examiner* — Jennifer T Nguyen
(74) *Attorney, Agent, or Firm* — Innovation Counsel LLP

(57) ABSTRACT

A display device includes: a sensor configured to detect a user's biometric information; a display panel including a substrate disposed on the sensor, a pixel defining layer disposed on the substrate, and a light emitting element disposed in an opening of the pixel defining layer, wherein the display panel has a transmission area that overlaps the sensor when viewed from a plane; and an optical layer comprising a hole that overlaps the transmission area.

19 Claims, 31 Drawing Sheets

(56) References Cited

U.S. PATENT DOCUMENTS

| | | | | |
|---|---|---|---|---|
| 2019/0094425 A1* | 3/2019 | Liu | ........................ | G02B 5/003 |
| 2019/0237521 A1 | 8/2019 | Ju | | |
| 2019/0251326 A1* | 8/2019 | Sun | .................... | G06V 40/1324 |
| 2019/0393444 A1* | 12/2019 | Nam | .................... | H01L 27/3262 |
| 2020/0064679 A1* | 2/2020 | Li | ........................ | G02F 1/1343 |
| 2020/0127066 A1* | 4/2020 | Zhang | .................... | G06V 10/17 |
| 2021/0083023 A1* | 3/2021 | Zheng | ................. | H01L 27/3276 |
| 2021/0357613 A1 | 11/2021 | Lim et al. | | |

FOREIGN PATENT DOCUMENTS

| | | |
|---|---|---|
| KR | 10-2020-0001299 A | 1/2020 |
| KR | 10-2021-0142789 A | 11/2021 |

* cited by examiner

DISPLAY DEVICE

CROSS-REFERENCE TO RELATED APPLICATIONS

This U.S. non-provisional patent application claims priority under 35 U.S.C. § 119 of Korean Patent Application No. 10-2020-0108005, filed on Aug. 26, 2020, the disclosure of which is hereby incorporated by reference in its entirety.

BACKGROUND

The present disclosure relates to a display device, and more particularly, to a display device including a sensor for recognizing biometric information of a user.

Electronic devices such as smart phones, digital cameras, notebook computers, navigation systems, and smart televisions typically include a display device for displaying images. The display device generates an image and provides the generated image to a user through a display screen.

The display device provides various functions that enable visual communication and interaction with users, such as providing information to users by displaying an image or sensing a user's input. Recent display devices also include a function for detecting a user's biometric information, for example, a fingerprint. As an example of fingerprint detection, an optical fingerprint sensor may be used to detect light reflected and scattered by a user's fingerprint.

In recent display devices, a fingerprint sensor for detecting a fingerprint may be implemented on a rear surface of a display panel.

SUMMARY

The present disclosure provides a display device in which a color filter layer and a pixel defining layer having a black color are arranged. The display device includes a transmission area with a predetermined light transmittance in a fingerprint detection area.

According to an embodiment of the inventive concept, a display device includes: a sensor configured to detect a user's biometric information; a display panel including a substrate disposed on the sensor, a pixel defining layer disposed on the substrate, and a light emitting element disposed in an opening of the pixel defining layer, wherein the display panel has a transmission area that overlaps the sensor when viewed from a plane; and an optical layer including a first hole that overlaps the transmission area.

The optical layer may include a first optical layer disposed in the display panel, and the first optical layer may include the first hole that overlaps the transmission area.

The first optical layer may be disposed between the substrate and the pixel defining layer.

The pixel defining layer may include a second hole that overlaps the transmission area, and when viewed from the plane, the second hole may overlap the first hole.

The pixel defining layer may have a black color.

When viewed from the plane, the second hole may have a second area that is larger than a first area of the first hole.

The light emitting element may include a second electrode, and the second electrode of the light emitting element may include a third hole that overlaps the transmission area.

The display panel may further include a circuit element layer disposed between the substrate and the pixel defining layer, and the circuit element layer may include a fourth hole that overlaps the transmission area.

The optical layer may further include a second optical layer that is disposed between the display panel and the sensor, and the second optical layer may include a lens that is convex upwardly.

The display device may further include an adhesive layer disposed between the display panel and the second optical layer, and the adhesive layer may have a first refractive index that is lower than a second refractive index of the second optical layer.

The second optical layer may include a light blocking layer that is disposed under the lens, and the light blocking layer may include a transmission hole that overlaps the transmission area.

The second optical layer may further include: a transmission layer disposed under the lens; and a light blocking coating layer disposed on a lower surface of the transmission layer, wherein the light blocking coating layer may include a fifth hole that overlaps the transmission area.

The display device may further include an input detection part that includes a plurality of detection electrodes disposed on the pixel defining layer, portions of the plurality of detection electrodes that overlap the transmission area may be removed.

The display device may further include a color filter layer disposed on the display panel.

The color filter layer may include: a first color filter overlapping the light emitting element; a black matrix overlapping the pixel defining layer; and a second color filter overlapping the transmission area.

The second color filter may include a green color filter.

The second color filter may extend from the first color filter.

The transmission area may be provided in plurality.

According to another embodiment of the inventive concept, a display device includes: a sensor configured to detect a user's biometric information; a display panel including a substrate disposed on the sensor, a pixel defining layer disposed on the substrate, and a light emitting element disposed in an opening of the pixel defining layer, wherein the light emitting element has a transmission area; and an optical layer including a hole that overlaps the transmission area of the light emitting element when viewed from a plane.

According to another embodiment of the inventive concept, a display device includes: a display panel including a fingerprint detection area and a camera area; a fingerprint sensor disposed under the fingerprint detection area of the display panel; a camera disposed under the camera area of the display panel; and an optical layer overlapping the fingerprint detection area, wherein the fingerprint detection area includes a pixel area in which a plurality of pixels is disposed and a non-pixel area that has a light transmittance higher than that of the pixel area, wherein the optical layer has a hole that overlaps the non-pixel area.

BRIEF DESCRIPTION OF THE FIGURES

The accompanying drawings are included to provide further understanding of the inventive concept, and are incorporated in and constitute a part of the present disclosure. The drawings illustrate various embodiments of the inventive concept and, together with the detailed description, serve to explain principles of the inventive concept. In the drawings.

DETAILED DESCRIPTION

Figure 1:
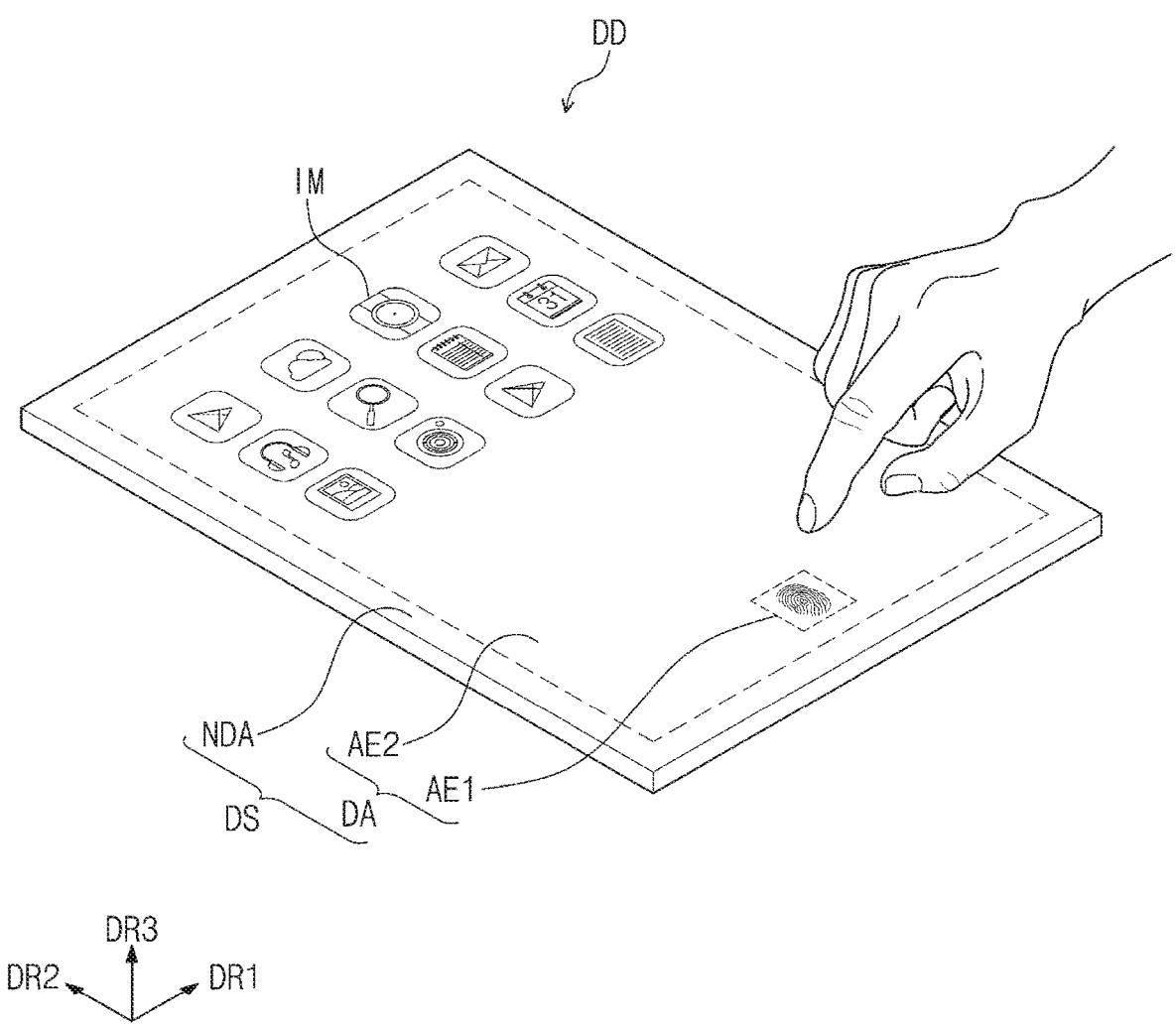
FIG. 1 is a perspective view of a display device according to an embodiment.

In the present disclosure, when an element (or region, layer, part, etc.) is referred to as being "on," "connected to," or "coupled to" another element, it means that it may be directly placed on/connected to/coupled to other components, or a third component may be arranged between them.

Like reference numerals refer to like elements. Additionally, in the drawings, the thicknesses, proportions, and dimensions of components may be exaggerated for effective description.

"And/or" includes all or one or more of the listed components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below," "the lower side," "on," and "the upper side" are used to describe a relative relationship of configurations as shown in the drawing. The terms are described as a relative concept based on a direction shown in the drawing.

Unless otherwise defined, terms (including technical and scientific terms) used herein have the same meaning as commonly understood by one of ordinary skill in the art to which the present inventive concept belongs. In addition, terms defined in a commonly used dictionary should be interpreted as having a meaning consistent with the meaning in the context of the related technology, and should not be interpreted in an ideal or overly formal sense unless the terms are explicitly defined herein.

In various embodiments of the inventive concept, the term "include," "comprise," "including," or "comprising" specifies a property, a region, a fixed number, a step, a process, an element, and/or a component but does not exclude other properties, regions, fixed numbers, steps, processes, elements, and/or components.

Hereinafter, embodiments of the inventive concept will be described in detail with reference to the drawings.

FIG. 1 is a perspective view of a display device according to an embodiment.

Referring to FIG. 1, a display device DD may have sides extending in a first direction DR1 and a second direction DR2 that crosses the first direction DR1. The display device DD may have a thickness in a third direction DR3.

Hereinafter, a direction that is substantially perpendicular to a plane defined by the first direction DR1 and the second direction DR2 is referred to as the third direction DR3. In the present disclosure, the phrase "when viewed from a plane" may mean a state viewed from the top or bottom in the third direction DR3.

When viewed from a plane, the display device DD may have a rectangular shape. However, the present inventive concept is not limited thereto, and the display device DD may have various shapes such as a circle and a polygon.

The upper surface of the display device DD may correspond to a display surface DS and may have a plane defined by the first direction DR1 and the second direction DR2. An image IM generated by the display device DD may be provided to a viewer through the display surface DS.

The display surface DS may include a display area DA and a non-display area NDA around the display area DA. The display area DA may display the image IM, and the non-display area NDA may not display an image. The non-display area NDA may surround the display area DA and may define an outline portion of the display device DD that has a predetermined color.

The display area DA may include a first area AE1 and a second area AE2. The second area AE2 may be disposed around the first area AE1. The first area AE1 may correspond to an area for detecting biometric authentication information of a user. For example, the first area AE1 may be a fingerprint detection area that detects user's fingerprint information.

When viewed from a plane, the first area AE1 may have a rectangular shape. However, this is only an example, and the shape of the first area AE1 is not limited thereto. For example, the shape of the first area AE1 may be variously modified, such as a circle or a polygon. The second area AE2 may surround the first area AE1.

Figure 2:
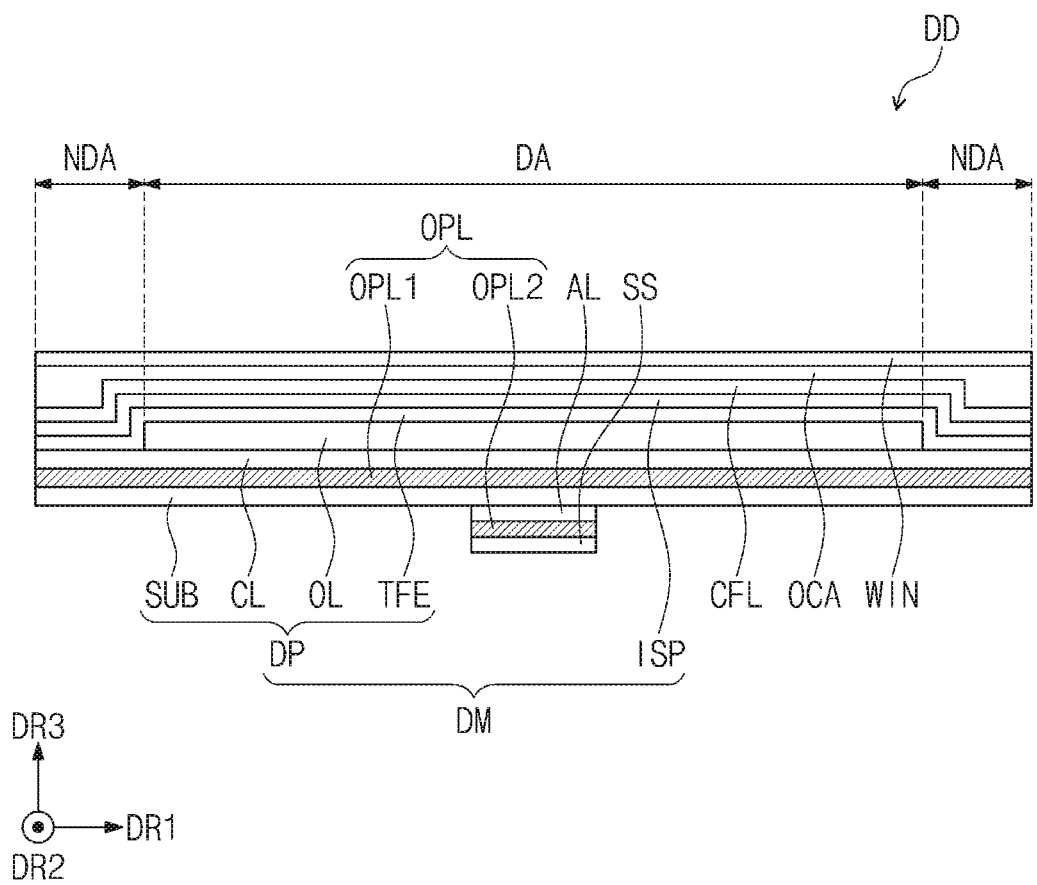
FIG. 2 is a cross-sectional view illustrating the display device of FIG. 1 according to an embodiment.

FIG. 2 is a cross-sectional view illustrating the display device DD of FIG. 1 according to an embodiment.

Referring to FIG. 2, the display device DD may include a display module DM, a color filter layer CFL, a window WIN, an optical layer OPL, and a sensor SS.

The display module DM may display an image and detect an external input. For example, the display module DM may include a display panel DP and an input detection part ISP.

The display panel DP may be a light emitting display panel, and the inventive concept is not particularly limited thereto. For example, the display panel DP may include an organic light emitting display panel or a quantum dot light emitting display panel. A light emitting layer of the organic light emitting display panel may include an organic light emitting material. A light emitting layer of the quantum dot light emitting display panel may include a quantum dot, a quantum rod, and/or the like. Hereinafter, the display panel DP implemented as the organic light emitting display panel is described as a non-limiting example of the inventive concept.

The display panel DP may include a substrate SUB, a circuit element layer CL disposed on the substrate SUB, a display element layer OL, and a thin film encapsulation layer TFE.

The substrate SUB may correspond to a lower part of the display panel DP. The substrate SUB may be transparent and may include a flexible plastic substrate. For example, the substrate SUB may include polyimide (PI). However, the inventive concept is not limited thereto. The substrate SUB may be a rigid substrate. For example, the substrate SUB may include glass.

The circuit element layer CL may be disposed on the substrate SUB. The circuit element layer CL may include an insulating layer, a semiconductor layer, a conductive layer, and a signal line. The insulating layer, the semiconductor layer, the conductive layer, and the signal line may be formed on the substrate SUB by a method such as coating and deposition, and thereafter, selectively patterned through a plurality of photolithography processes.

The display element layer OL may be disposed on the circuit element layer CL. The display element layer OL may overlap the display area DA. The display element layer OL may include a light emitting element. For example, the display element layer OL may include an organic light emitting material, a quantum dot, a quantum rod, or a micro LED.

The thin film encapsulation layer TFE may be disposed on the display element layer OL. The thin film encapsulation layer TFE may include at least two inorganic layers and an organic layer disposed between the inorganic layers. The inorganic layers may include an inorganic material, and may protect the display element layer OL from moisture/oxygen. The organic layer may include an organic material and may protect the display element layer OL from foreign substances such as dust particles.

The input detection part ISP may be disposed on the display panel DP. The input detection part ISP may detect an external input (for example, a user's touch), change the detected external input into an input signal, and provide the input signal to the display panel DP. The display panel DP may receive the input signal from the input detection part ISP and may generate an image corresponding to the input signal.

The color filter layer CFL may be disposed on the input detection part ISP. The color filter layer CFL may reduce reflectance of external light incident onto the display device DD toward the display module DM. The color filter layer CFL may serve as an antireflection film.

The window WIN may be disposed on the color filter layer CFL. The window WIN may protect the display panel DP and the input detection part ISP from external scratches and impacts. The window WIN may be attached to the color filter layer CFL by an adhesive OCA. The adhesive OCA may include an optical clear adhesive. The image generated by the display panel DP may pass through the window WIN to be displayed to the user.

The optical layer OPL may include one or more optical layers disposed inside the display panel DP or outside the display panel DP. For example, as shown in FIG. 2, the optical layer OPL may include a first optical layer OPL1 and a second optical layer OPL2. However, the optical layer OPL may include only one of the first optical layer OPL1 and the second optical layer OPL2 or more than two optical layers. The optical layer OPL may also be referred to a functional layer.

The first optical layer OPL1 may be disposed inside the display panel DP. For example, the first optical layer OPL1 may be disposed between the substrate SUB and the circuit element layer CL. However, the arrangement of the first optical layer OPL1 is not limited thereto. The first optical layer OPL1 may be disposed in or on another layer inside the display panel DP.

In the present example, the first optical layer OPL1 may be disposed on the substrate SUB. The first optical layer OPL1 may reflect or absorb external light incident to the display panel DP. For example, the first optical layer OPL1 may include a metallic material. Alternatively, the first optical layer OPL1 may have a color (e.g., black) that absorbs the external light.

According to the present embodiment, the first optical layer OPL1 may prevent components (e.g., the sensor SS) that are disposed under the substrate SUB from being visually recognized to the user. In addition, the first optical layer OPL1 may control external light to be transmitted to the substrate SUB only in a specific area. This will be described later in further detail.

The second optical layer OPL2 may be disposed under the display panel DP. For example, the second optical layer OPL2 may be disposed on the lower surface of the substrate SUB of the display panel DP by an adhesive layer AL. The second optical layer OPL2 may overlap the first area AE1 illustrated in FIG. 1. The second optical layer OPL2 may control external light transmitted through the display panel DP. Details of the second optical layer OPL2 will be described later in further detail.

The sensor SS may be disposed under the display panel DP. For example, as shown in FIG. 2, the sensor SS may be disposed under the second optical layer OPL2. When the optical layer OPL includes only the first optical layer OPL1, the sensor SS may be disposed under the substrate SUB without the second optical layer OPL2 interposed therebetween.

The sensor SS may detect the user's biometric authentication information. For example, the sensor SS may include an optical fingerprint sensor. The optical fingerprint sensor may detect light incident through a transmission area PEA defined in the first area AE1 (see FIG. 8). Details on the transmission area will be described later in further detail.

Figure 3:
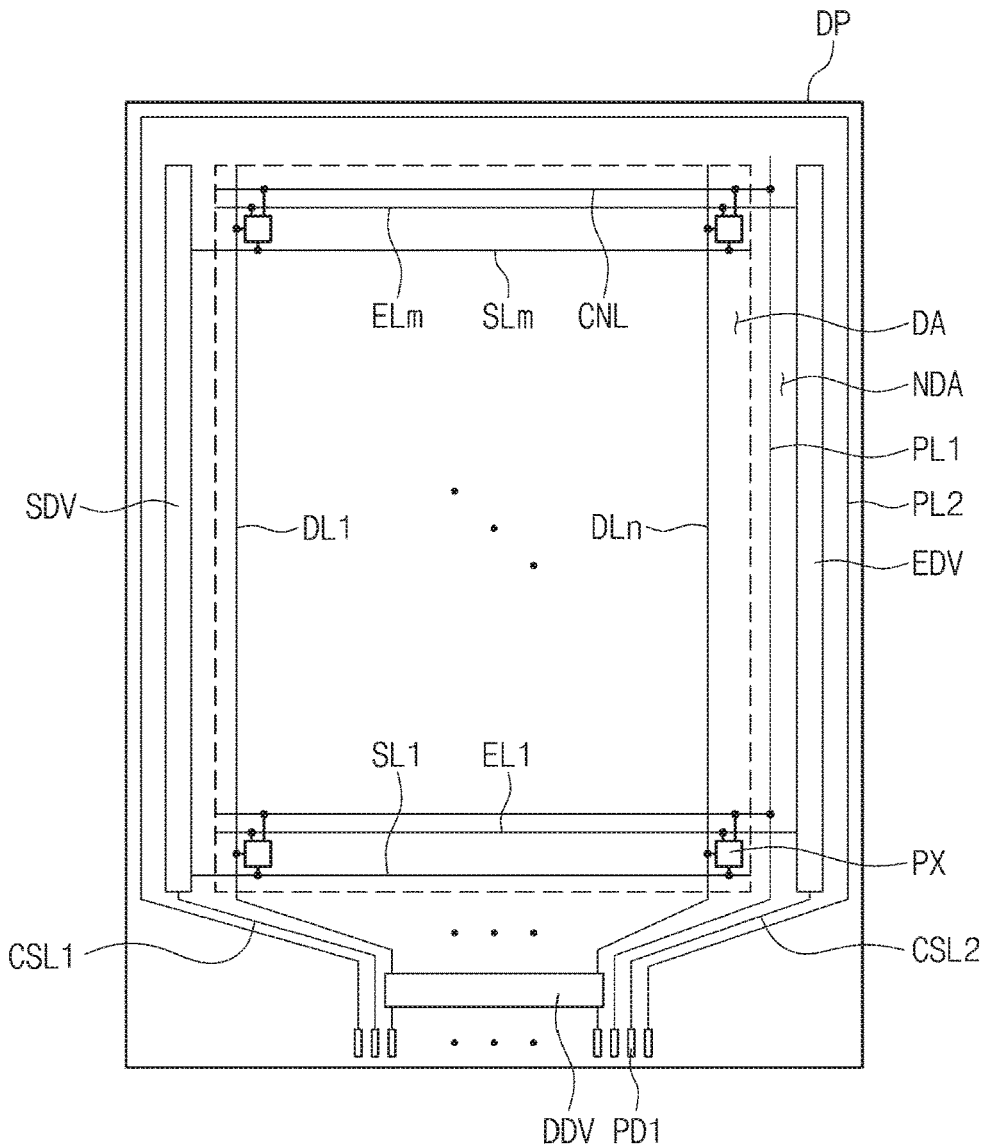
FIG. 3 is a plan view illustrating a display panel shown in FIG. 2 according to an embodiment.
Figure 3:
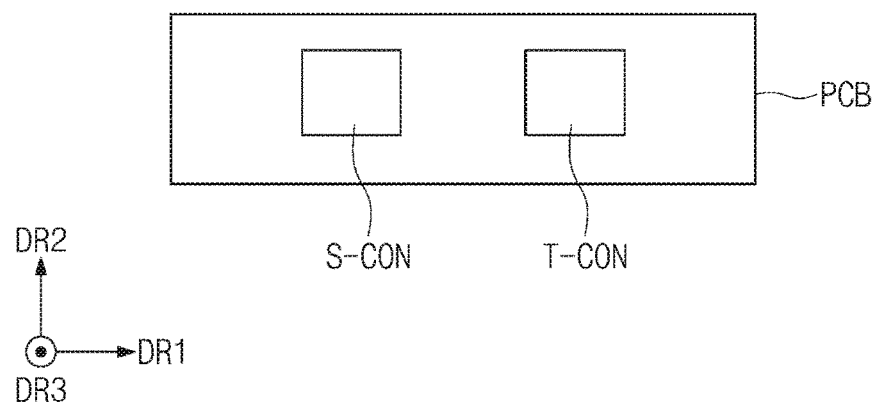

FIG. 3 is a plan view illustrating the display panel DP shown in FIG. 2 according to an embodiment.

Referring to FIG. 3, the display device DD includes the display panel DP, a scan driver SDV, a data driver DDV, an emission driver EDV, a printed circuit board PCB, a timing controller T-CON, and a detection controller S-CON. The display panel DP may have a rectangular shape having short sides extending in the first direction DR1 and long sides extending in the second direction DR2. The display panel DP may include the display area DA and the non-display area NDA surrounding the display area DA.

The display panel DP may include a plurality of pixels PX, a plurality of scan lines SL1 to SLm, a plurality of data lines DL1 to DLn, a plurality of light emission lines EL1 to ELm, a first control line CSL1, a second control line CSL2, a first power line PL1, a second power line PL2, a plurality of connection lines CNL, and a plurality of first pads PD1. m and n are natural numbers.

The pixels PX may be disposed in the display area DA of the display panel DP. The scan driver SDV and the emission driver EDV may be disposed in the non-display area NDA adjacent to the long sides of the display panel DP, respectively. The data driver DDV may be disposed in the non-display area NDA adjacent to one of the short sides of the display panel DP. When viewed from a plane, the data driver DDV may be adjacent to the lower end of the display panel DP. The data driver DDV may be in the form of an integrated circuit chip and mounted on the display panel DP.

The scan lines SL1 to SLm may extend in the first direction DR1 to connect the pixels PX and the scan driver SDV. The data lines DL1 to DLn may extend in the second direction DR2 to connect the pixels PX and the data driver DDV. The emission lines EL1 to ELm may extend in the first direction DR1 to connect the pixels PX and the emission driver EDV.

The first power line PL1 may extend in the second direction DR2 and may be disposed in the non-display area NDA. The first power line PL1 may be disposed between the display area DA and the emission driver EDV, but the inventive concept is not limited thereto, and the first power line PL1 may be disposed between the display area DA and the scan driver SDV.

The connection lines CNL may extend in the first direction DR1 and may be arranged in the second direction DR2. The connection lines CNL may be connected to the first power line PL1 and the pixels PX. A first voltage may be applied to the pixels PX through the first power line PL1 and the connection lines CNL.

The connection lines CNL may be integrally formed with the first power line PL1 to extend from the first power line PL1. However, the inventive concept is not limited thereto, and the connection lines CNL may be disposed in a layer different from the layer that includes the first power line PL1 and may be connected to the first power line PL1 through separate connection wires and/or electrodes. The connection lines CNL and the first power line PL1 may also be collectively referred to as the first power line PL1.

The second power line PL2 may be disposed in the non-display area NDA. The second power line PL2 may extend along long sides and a short side (e.g., the top side) of the display panel DP where the data driver DDV is not disposed. The second power line PL2 may be disposed outside the scan driver SDV and the emission driver EDV. Although not shown, the second power line PL2 may extend toward the display area DA to be connected to the pixels PX. A second voltage having a level lower than the first voltage may be applied to the pixels PX through the second power line PL2.

The first control line CSL1 may be connected to the scan driver SDV and may extend toward the lower end of the display panel DP when viewed from a plane. The second control line CSL2 may be connected to the emission driver EDV and may extend toward the lower end of the display panel DP when viewed from a plane. The data driver DDV may be disposed between the first control line CSL1 and the second control line CSL2.

The first pads PD1 may be disposed on the display panel DP adjacent to the lower end of the display panel DP. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1.

The printed circuit board PCB may be connected to the first pads PD1. The timing controller T-CON and the detection controller S-CON may be in the form of integrated circuit chips and mounted on the printed circuit board PCB. The timing controller T-CON may be connected to the data driver DDV and the first pads PD1 through the printed circuit board PCB. Although not shown in the drawings, a voltage generator (not shown) for generating the first and second voltages may be disposed on the printed circuit board PCB, and may be connected to the first pads PD1 connected to the first and second power lines PL1 and PL2.

The timing controller T-CON may generate a scan control signal, a data control signal, and an emission control signal. The scan control signal may be provided to the scan driver SDV through the first control line CSL1. The emission control signal may be provided to the emission driver EDV through the second control line CSL2. The data control signal may be provided to the data driver DDV. The timing controller T-CON may provide image signals to the data driver DDV.

The scan driver SDV may generate a plurality of scan signals in response to the scan control signal, and the scan signals may be applied to the pixels PX through the scan lines SL1 to SLm. The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal, and the emission signals may be applied to the pixels PX through the emission lines EL1 to ELm.

The pixels PX may be provided with the data voltages in response to the scan signals. The pixels PX may display an image by emitting light having luminance corresponding to the data voltages in response to the emission signals. An emission time of the pixels PX may be controlled by the emission signals.

The detection controller S-CON may be connected to a plurality of second and third pads PD2 and PD3 of the input detection part ISP, which will be described below, through the printed circuit board PCB. The detection controller S-CON may provide signals for driving the input detection part ISP.

Hereinafter, the structure of the display panel DP will be described in more detail.

Figure 4:
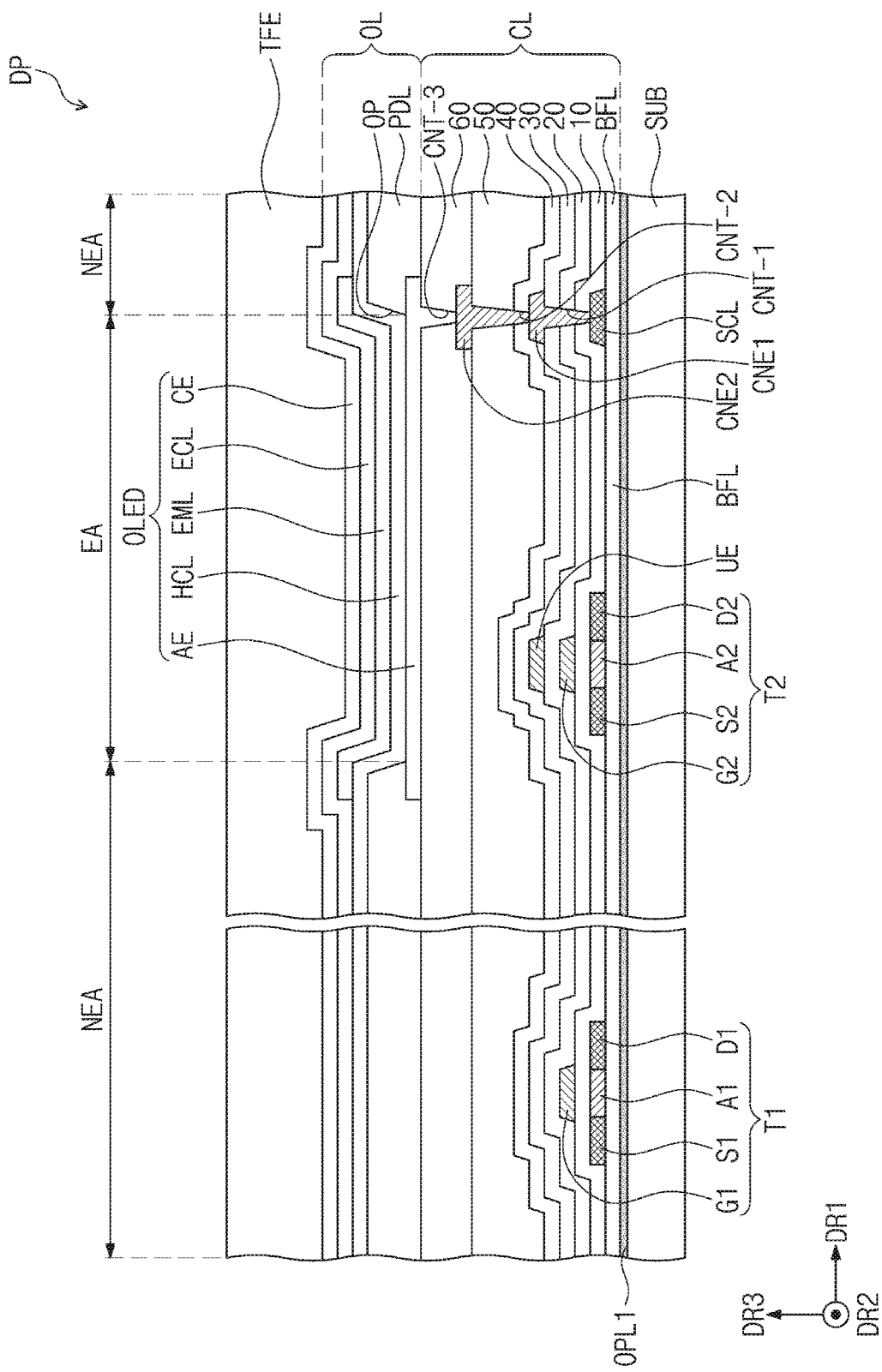
FIG. 4 is a cross-sectional view illustrating the display panel of FIG. 2 according to an embodiment.

FIG. 4 is a cross-sectional view illustrating the display panel DP of FIG. 2 according to an embodiment. Referring to FIG. 4, the substrate SUB may include an emission area EA and a non-emission area NEA around the emission area EA. The non-emission area NEA may be arranged to surround the periphery of the emission area EA.

The circuit element layer CL may include a buffer layer BFL, a first transistor T1, a second transistor T2, and a first insulating layer 10, a second insulating layer 20, a third insulating layer 30, a fourth insulating layer 40, a fifth insulating layer 50, and a sixth insulating layer 60.

The buffer layer BFL may be disposed on the first optical layer OPL1. However, as described above, the first optical layer OPL1 may be omitted. In this case, the buffer layer BFL may be disposed on the substrate SUB.

The buffer layer BFL may improve bonding between the substrate SUB and the semiconductor pattern of the circuit element layer CL to be disposed thereon. The buffer layer BFL may include a silicon oxide layer and a silicon nitride layer. The silicon oxide layer and the silicon nitride layer may be alternately stacked. The semiconductor pattern disposed on the buffer layer BFL may include polysilicon. However, the inventive concept is not limited thereto, and the semiconductor pattern may include amorphous silicon or metal oxide.

The first transistor T1 and the second transistor T2 may be disposed on the buffer layer BFL. A source S1, an active region A1, and a drain D1 of the first transistor T1, and a source S2, an active region A2, and a drain D2 of the second transistor T2 may be formed from the semiconductor pattern. The sources S1 and S2 and the drains D1 and D2 may extend in opposite directions from the active regions A1 and A2 on a cross section, respectively. FIG. 4 illustrates a part of a connection signal line SCL formed from the semiconductor pattern. Although not shown in the drawings separately, the connection signal line SCL may be connected to the drain D2 of the second transistor T2.

The first insulating layer 10 may be disposed on the buffer layer BFL. The first insulating layer 10 may commonly overlap the plurality of pixels PX and may cover the semiconductor pattern. The first insulating layer 10 may include an inorganic layer and/or an organic layer, and may have a single layer or a multilayer structure. The first insulating layer 10 may include at least one of aluminum oxide, titanium oxide, silicon oxide, silicon oxynitride, zirconium oxide, and hafnium oxide. In one embodiment, the first insulating layer 10 may be a single-layer silicon oxide layer.

A gate G1 of the first transistor T1 and a gate G2 of the second transistor T2 may be disposed on the first insulating layer 10. The gate G1 may correspond to a part of a metal pattern. The gates G1 and G2 may overlap the active regions A1 and A2 in a plan view. In the process of doping the semiconductor pattern, the gates G1 and G2 may be used as a mask.

The second insulating layer 20 that covers the gates G1 and G2 may be disposed on the first insulating layer 10. The second insulating layer 20 may commonly overlap the pixels PX. The second insulating layer 20 may include an inorganic layer and/or an organic layer, and may have a single layer or a multilayer structure. In one embodiment, the second insulating layer 20 may be a single-layer silicon oxide layer.

An upper electrode UE may be disposed on the second insulating layer 20. The upper electrode UE may overlap the gate G2 of the second transistor T2. The upper electrode UE may correspond to a part of a metal pattern. A portion of the gate G2 and the upper electrode UE that overlap the second insulating layer 20 may form a capacitor. In an embodiment, the upper electrode UE may be omitted.

The third insulating layer 30 that covers the upper electrode UE may be disposed on the second insulating layer 20. In one embodiment, the third insulating layer 30 may be a single-layer silicon oxide layer. A first connection electrode CNE1 may be disposed on the third insulating layer 30. The first connection electrode CNE1 may be connected to the connection signal line SCL through a contact hole CNT-1 that penetrates through the first, second, and third insulating layers 10, 20, and 30.

The fourth insulating layer 40 may be disposed on the third insulating layer 30. The fourth insulating layer 40 may be a single layer of silicon oxide. The fifth insulating layer 50 may be disposed on the fourth insulating layer 40. The fifth insulating layer 50 may include an organic layer. A second connection electrode CNE2 may be disposed on the fifth insulating layer 50. The second connection electrode CNE2 may be connected to the first connection electrode CNE1 through a contact hole CNT-2 that penetrates through the fourth insulating layer 40 and the fifth insulating layer 50. The sixth insulating layer 60 that covers the second connection electrode CNE2 may be disposed on the fifth insulating layer 50. The sixth insulating layer 60 may include an organic layer.

The display element layer OL may be disposed on the circuit element layer CL. Specifically, the display element layer OL may be connected to the circuit element layer CL. The display element layer OL may include a light emitting element OLED and a pixel defining layer PDL.

The pixel defining layer PDL may be disposed on the circuit element layer CL. Specifically, the pixel defining layer PDL may be disposed on the sixth insulating layer 60. The pixel defining layer PDL may overlap the non-emission area NEA. A plurality of pixel openings OP that overlaps the emission area EA may be defined in the pixel defining layer PDL. The pixel defining layer PDL may absorb external light incident onto the substrate SUB. For example, the pixel defining layer PDL may have a black color.

The light emitting elements OLED may be disposed in a pixel opening OP defined in the pixel defining layer PDL. The light emitting elements OLED may include a first electrode AE, a hole control layer HCL, a light emitting layer EML, an electron control layer ECL, and a second electrode CE.

The first electrode AE may be disposed on the sixth insulating layer 60. The first electrode AE may be connected to the second connection electrode CNE2 through a contact hole CNT-3 that penetrates through the sixth insulating layer 60. At least a portion of the first electrode AE may be exposed by the pixel opening OP of the pixel defining layer PDL. The first electrode AE may reflect light. For example, the first electrode AE may include a reflective electrode.

The hole control layer HCL may be commonly disposed in the pixel area PA and the non-pixel area NPA. The hole control layer HCL may include a hole transport layer and may further include a hole injection layer. The light emitting layer EML may be disposed on the hole control layer HCL. The light emitting layer EML may be disposed in an area corresponding to the pixel opening OP. For example, the light emitting layer EML may be formed separately on each of the plurality of pixels PX.

The electron control layer ECL may be disposed on the light emitting layer EML. The electron control layer ECL may include an electron transport layer and may further include an electron injection layer. The hole control layer HCL and the electron control layer ECL may be commonly formed using an open mask. The second electrode CE may be disposed on the electronic control layer ECL. The second electrode CE may have an integral shape and may be commonly disposed to overlap the plurality of pixels PX.

The thin film encapsulation layer TFE may be disposed on the second electrode CE. The thin film encapsulation layer TFE may cover the display element layer OL. The thin film encapsulation layer TFE may include an inorganic layer, an organic layer, and an inorganic layer that are sequentially stacked. The inorganic layers may include an inorganic material and may protect the pixels PX from moisture/oxygen. The organic layer may include an organic material and may protect the pixels PX from foreign substances such as dust particles.

However, the structure of the display panel DP is not limited thereto. For example, the display panel DP may include an encapsulation substrate (not shown) including glass and a sealing layer (not shown) instead of the thin film encapsulation layer TFE.

Figure 5:
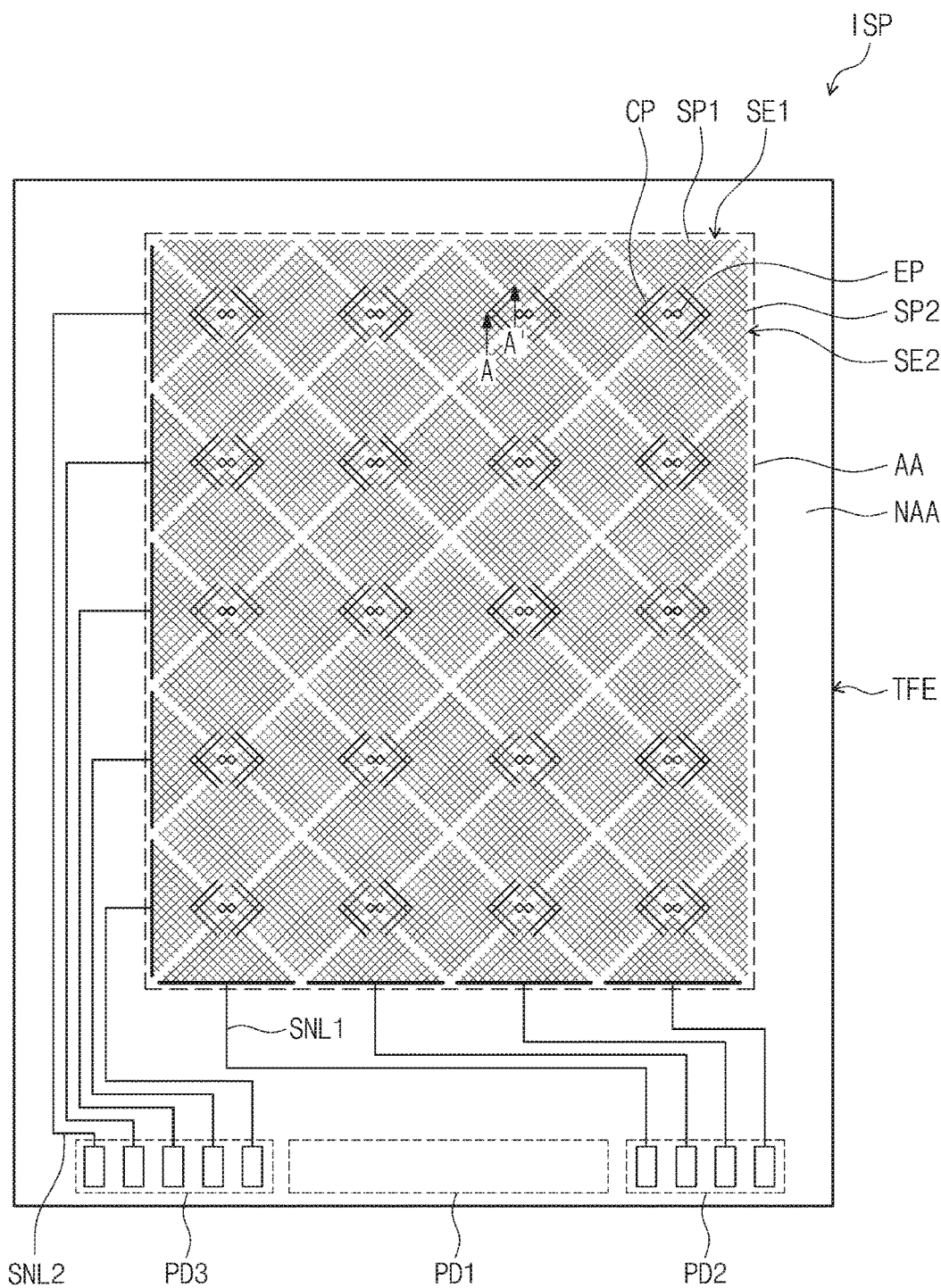
FIG. 5 is a plan view illustrating an input detection part shown in FIG. 2 according to an embodiment.
Figure 6:
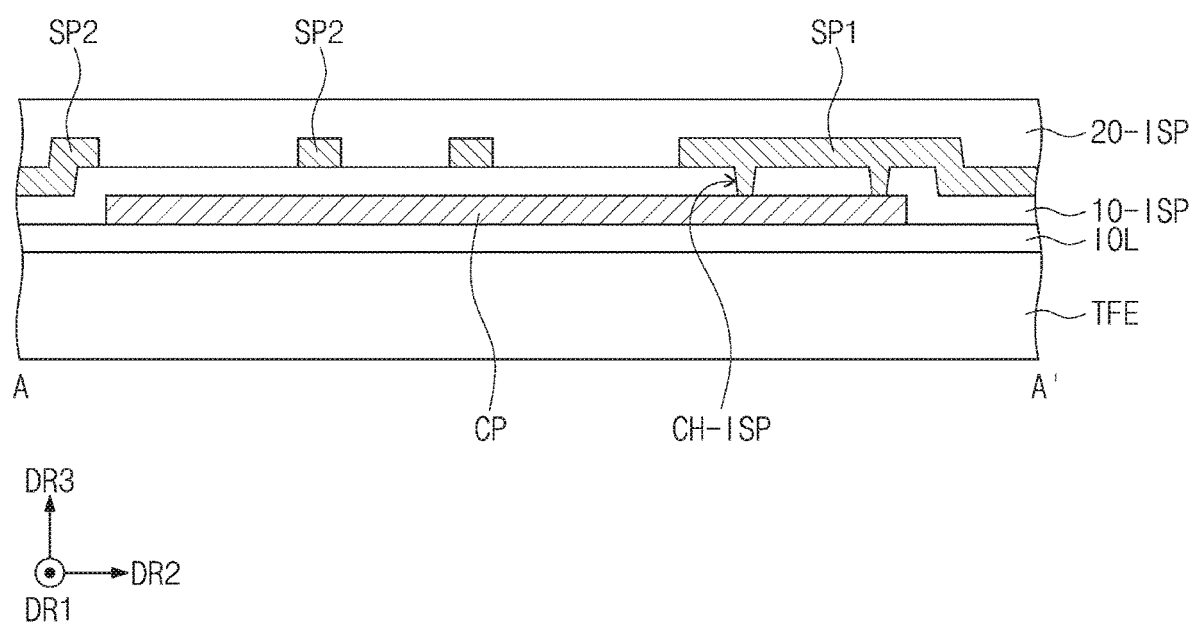
FIG. 6 is a cross-sectional view of a portion of a connection pattern shown in FIG. 5 according to an embodiment.

FIG. 5 is a plan view illustrating the input detection part ISP shown in FIG. 2 according to an embodiment. FIG. 6 is a cross-sectional view of a portion of the connection pattern shown in FIG. 5. For example, FIG. 6 shows a cross section from point A to point A' shown in FIG. 5.

Referring to FIG. 5, the input detection part ISP may include a plurality of detection electrodes SE1 and SE2, a plurality of wires SNL1 and SNL2, and the plurality of second and third pads PD2 and PD3. The detection electrodes SE1 and SE2, the wires SNL1 and SNL2, and the second and third pads PD2 and PD3 may be disposed on the thin film encapsulation layer TFE.

The input detection part ISP may have an active area AA and an inactive area NAA that is disposed around the active area AA. The active area AA may overlap the display area DA, and the inactive area NAA may overlap the non-display area NDA. The detection electrodes SE1 and SE2 may be disposed in the active area AA, and the second and third pads PD2 and PD3 may be disposed in the inactive area NAA.

The wires SNL1 and SNL2 may be connected to one ends of the detection electrodes SE1 and SE2, and may extend from the active area AA to the inactive area NAA to be connected to the second and third pads PD2 and PD3. The second and third pads PD2 and PD3 may be connected to the above-described printed circuit board PCB (refer to FIG. 3). The above-described detection controller S-CON may be connected to the second and third pads PD2 and PD3 through the printed circuit board PCB.

The detection electrodes SE1 and SE2 may include a plurality of first detection electrodes SE1 extending in the first direction DR1 and arranged in the second direction DR2, and a plurality of second detection electrodes SE2 extending in the second direction DR2 and arranged in the first direction DR1. The second detection electrodes SE2 may be insulated from and extended to cross the first detection electrodes SE1 in a plan view.

The wires SNL1 and SNL2 may include a plurality of first signal wires SNL1 connected to the first detection electrodes SE1 and a plurality of second signal wires SNL2 connected to the second detection electrodes SE2. The first signal wires SNL1 may be connected to the second pads PD2. The second signal wires SNL2 may be connected to the third pads PD3.

The first detection electrodes SE1 may correspond to output detection electrodes, and the second detection electrodes SE2 may correspond to input detection electrodes. The input detection part ISP may be driven in a mutual detection mode. For example, driving signals may be applied to the second detection electrodes SE2 through the second signal wires SL2, and sensing signals that are outputted from the first detection electrodes SE1 may be received through the first signal wires SL1.

Each of the first detection electrodes SE1 may include a plurality of first detection parts SP1 arranged in the first direction DR1 and a plurality of connection patterns CP. Each of the connection patterns CP may be disposed between two first detection parts SP1 adjacent to each other in the second direction DR2 to connect the two adjacent first detection parts SP1.

Each of the second detection electrodes SE2 may include a plurality of second detection parts SP2 arranged in the second direction DR2 and a plurality of extension patterns EP. Each of the extension patterns EP may be disposed between two second detection parts SP2 adjacent to each other in the first direction DR1 to connect the two adjacent second detection parts SP2.

The first detection parts SP1 and the second detection parts SP2 may have a mesh shape. The first detection parts SP1 and the second detection parts SP2 may not overlap each other but may be spaced apart from each other. For example, the first detection parts SP1 and the second detection parts SP2 may be alternately disposed with each other in a plan view. Electrostatic capacitance may be formed by the first detection parts SP1 and the second detection parts SP2. The extension patterns EP may not overlap the connection patterns CP in a plan view.

The first and second detection parts SP1 and SP2 and the extension patterns EP may be disposed on the same layer. The connection patterns CP may be disposed in a layer different from the layer that includes the first and second detection parts SP1 and SP2 and the extension patterns EP.

FIG. 6 shows a cross section from a portion of the connection pattern CP connected to the first detection part SP1 disposed on the upper side to a portion of the connection pattern. CP overlapping the second detection part SP2 disposed on the left side shown in FIG. 5. Although not shown FIG. 6, in FIG. 5, a cross section from a portion of the connection pattern CP connected to the first detection part SP1 disposed below to a portion of the connection pattern CP overlapping the second detection part SP2 disposed on the left side may be symmetrical with FIG. 6.

Referring to FIG. 6, an insulating layer IOL may be disposed on the thin film encapsulation layer TFE. The insulating layer IOL may include an inorganic layer. The connection pattern CP may be disposed on the insulating layer IOL. A first insulating layer 10-ISP may be disposed on the connection pattern CP and the insulating layer IOL. The first insulating layer 10-ISP may include an inorganic layer or an organic layer. The first detection parts SP1 and the second detection parts SP2 may be disposed on the first insulating layer 10-ISP. The extension pattern EP may be integrally formed with the second detection parts SP2 and may be disposed on the first insulating layer 10-ISP.

The connection pattern CP may be connected to the first detection parts SP1 through a plurality of contact holes CH-ISP defined in the first insulating layer 10-ISP. A second insulating layer 20-ISP may be disposed on the first insulating layer 10-ISP to cover the first detection parts SP1 and the second detection parts SP2. The second insulating layer 20-ISP may include an organic layer.

Figure 7:
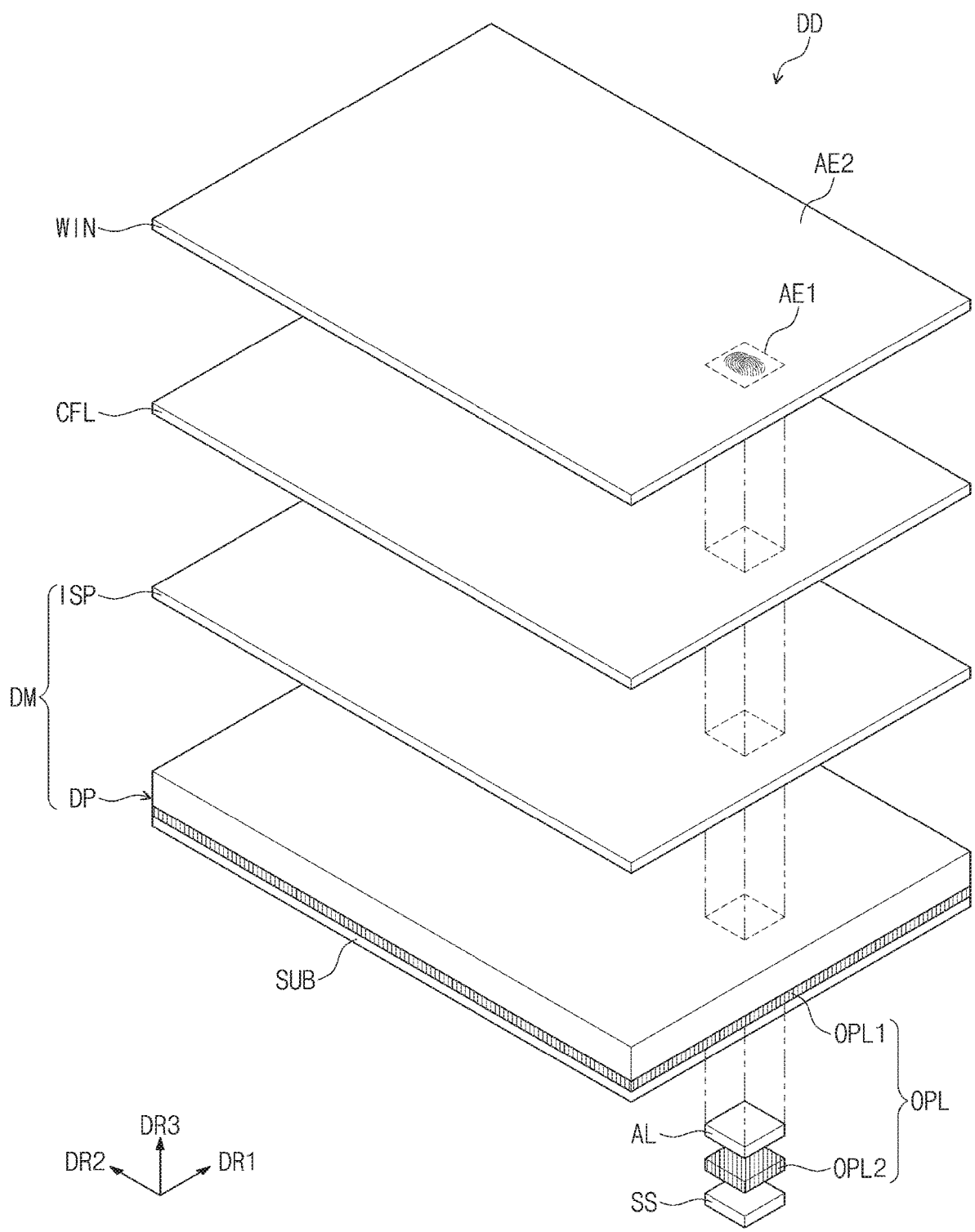
FIG. 7 is an exploded perspective view illustrating the display device of FIG. 1 according to an embodiment.

FIG. 7 is an exploded perspective view illustrating the display device DD of FIG. 1 according to an embodiment.

Referring to FIG. 7, the first area AE1 may overlap the sensor SS. The first area AE1 may be defined in each of a plurality of layers of the display device DD including the input detection part ISP, the color filter layer CFL, the window WIN, and the second optical layer OPL2. The first area AE1 may also be defined in the first optical layer OPL1 that is disposed in the display panel DP.

The first area AE1 may have a predetermined light transmittance so that the light reflected from the user's fingerprint reaches the sensor SS. For example, the first area AE1 may have a higher light transmittance than the second area AE2 that surrounds the first area AE1.

The first area AE1 for detecting a fingerprint is defined in at least a portion of the display area DA, but the embodiment of the inventive concept is not limited thereto. For example, the first area AE1 for detecting a user's fingerprint may overlap the entire display area DA, and the second area AE2 may overlap the non-display area NDA. In this case, the sensor SS for detecting the user's fingerprint may overlap the display area DA.

Hereinafter, the first area AE1 defined in each layer of the display device DD illustrated in FIG. 7 will be described in detail.

Figure 8:
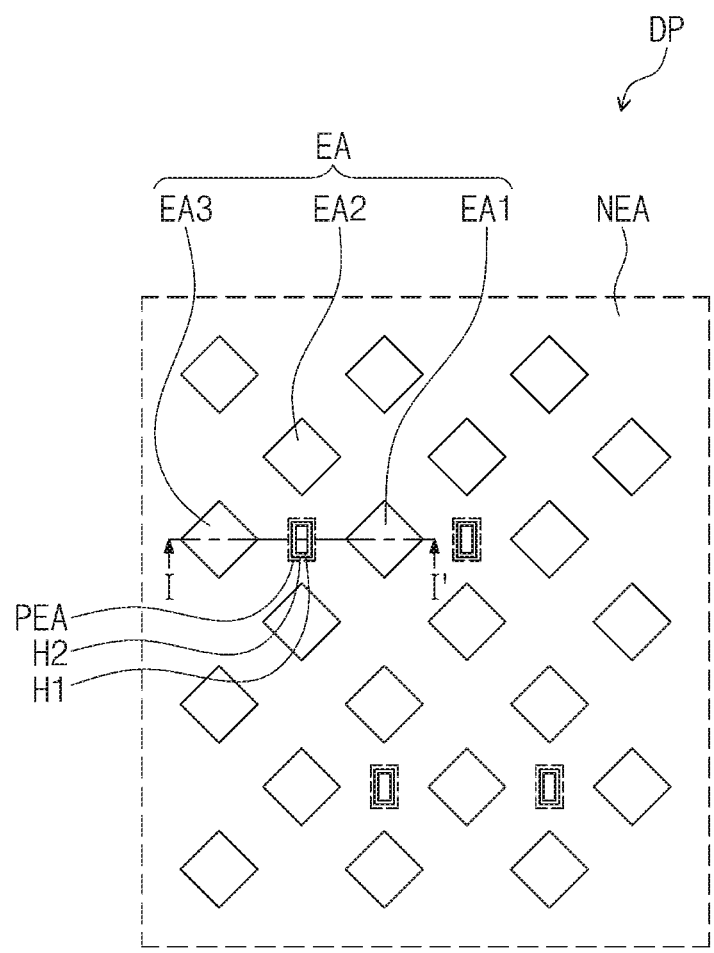
FIG. 8 is a plan view illustrating a first area of the display panel of FIG. 7 according to an embodiment.
Figure 9A:
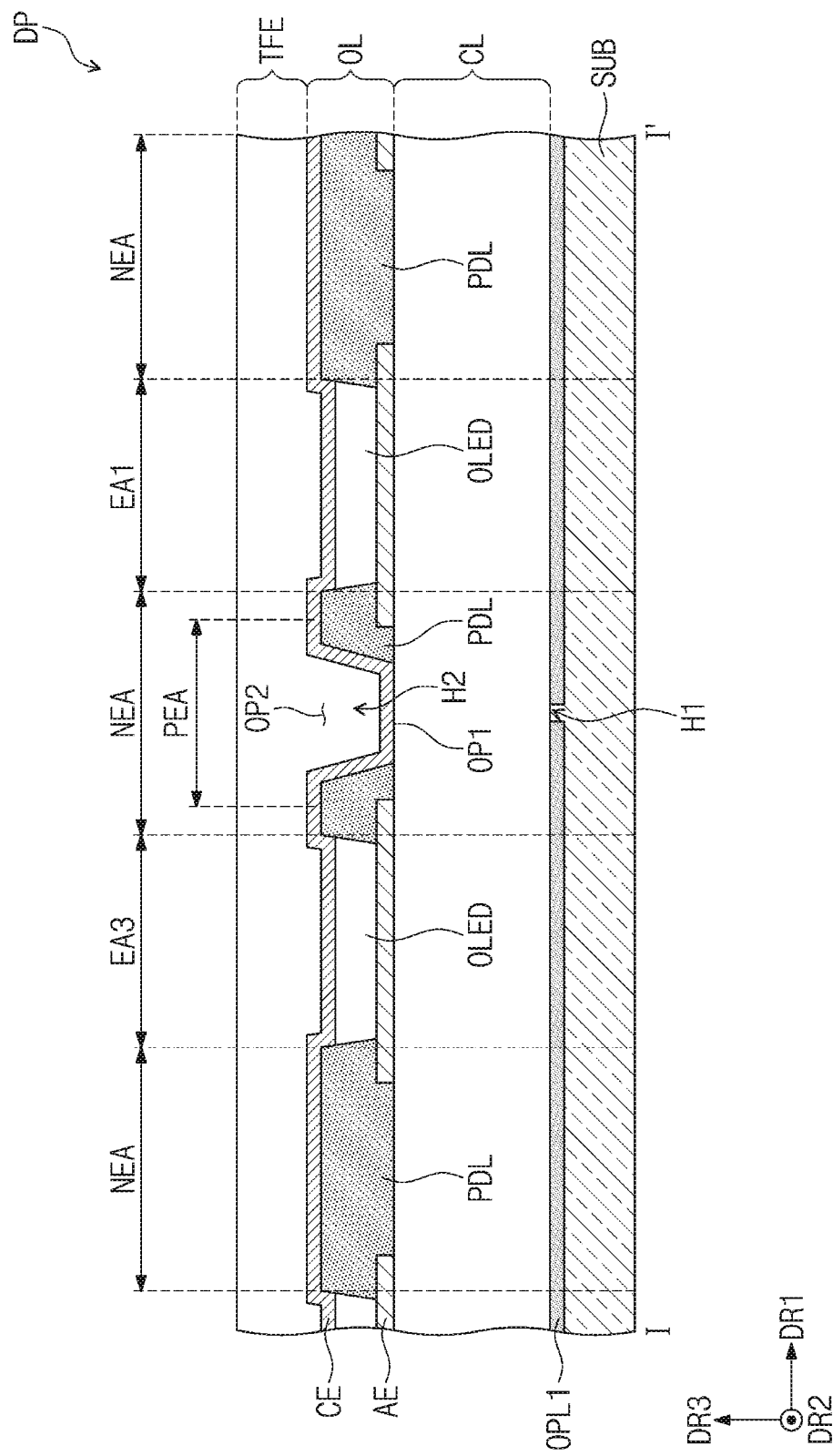
FIG. 9A is a cross-sectional view of the line I-I' shown in FIG. 8.

FIG. 8 is a plan view illustrating a first area of the display panel DP of FIG. 7 according to an embodiment. FIG. 9A is a cross-sectional view of the line I-I' shown in FIG. 8. In FIG. 9A, for convenience of description, illustration of the circuit element layer CL and the display element layer OL of the display panel DP is simplified.

Referring to FIG. 8, the display panel DP may include the emission area EA, the non-emission area NEA, and the transmission area PEA. The emission area EA may emit light. Specifically, the emission area EA may include a first emission area EA1, a second emission area EA2, and a third emission area EA3. Each of the first, second, and third emission areas EA1, EA2, and EA3 may be disposed to be spaced apart from each other. For example, the first, second, and third emission areas EA1, EA2, and EA3 may be disposed to be spaced apart in the fourth direction DR4 or the fifth direction DR5.

Here, the fourth and fifth directions DR4 and DR5 may be diagonal directions. The fourth direction DR4 may form a predetermined angle with the first direction DR1. For example, the predetermined angle may be 45°. The fifth direction DR5 may cross the fourth direction DR4. For example, the fifth direction DR5 may form a right angle with the fourth direction DR4.

When viewed from a plane, each of the first, second, and third emission areas EA1, EA2, and EA3 may have a rhombus shape. However, the inventive concept is not limited thereto, and the first, second, and third emission areas EA1, EA2, and EA3 may have various shapes such as polygonal and circular shapes, and may have shapes different from one another.

Each of the first, second, and third emission areas EA1, EA2, and EA3 may emit light having different colors. For example, the first emission areas EA1 may emit light having a red color, the second emission areas EA2 may emit light having a green color, and the third emission areas EA3 may emit light having a blue color. However, colors of the light emitted by the first, second, and third emission areas EA1, EA2, and EA3 are not limited to those described above. For example, some of the first, second, and third emission areas EA1, EA2, and EA3 may emit magenta, cyan, or white colors.

For convenience of description, the first, second, and third emission areas EA1, EA2, and EA3 are shown to have the same size, but the first, second, and third emission areas EA1, EA2, and EA3 may have different sizes without deviating from the scope of the inventive concept. For example, the size of the third emission area EA3 emitting light of a blue color may be the largest, and the size of the second emission area EA2 emitting light of a green color may be the smallest.

Unlike the emission area EA, the non-emission area NEA may not emit light. The non-emission area NEA may surround the first, second, and third emission areas EA1, EA2, and EA3.

A plurality of transmission areas PEA may be defined in the non-emission area NEA. The transmission areas PEA may be disposed among the first, second, and third emission areas EA1, EA2, and EA3. In FIG. 8, four transmission areas PEA are illustrated, but these are merely illustrative. In one embodiment, the number of transmission areas PEA disposed per a unit area may be different from four.

When viewed from a plane, each of the transmission areas PEA may have a rectangular shape. However, the inventive concept is not limited thereto, and the transmission areas PEA may have various shapes such as circular and polygonal shapes.

The transmission area PEA may include a first hole H1 and a second hole H2. When viewed from a plane, each of the first hole H1 and the second hole H2 may have a rectangular shape. However, the shape of the first hole H1 and the second hole H2 is not limited thereto. The first hole H1 and the second hole H2 may have various shapes such as circular and polygonal shapes.

When viewed from a plane, the area of the first hole H1 may be smaller than the area of the second hole H2, and the area of the second hole H2 may be smaller than the transmission area PEA. Each of the first hole H1 and the second hole H2 may be defined in the first optical layer OPL1 and the display element layer OL. A detailed description of the first hole H1 and the second hole H2 will be described later.

External light incident onto the display panel DP may reach the sensor SS (refer to FIG. 7) that is disposed under the display panel DP through the transmission areas PEA. The light reached the sensor SS may contain the user's fingerprint authentication information.

Referring to FIG. 9A, the light emitting elements OLED may overlap the first and third emission areas EA1 and EA3. Referring to FIG. 8, the light emitting elements OLED may also overlap the second emission areas EA2 although it is not shown in FIG. 9A. The pixel defining layer PDL may overlap the non-emission area NEA. The transmission area PEA defined in the non-emission area NEA may overlap the pixel defining layer PDL.

The first hole H1 of the transmission area PEA may be defined in the first optical layer OPL1. Some of the external light incident toward the first optical layer OPL1 may be incident onto the substrate SUB through the first hole H1, and the rest of the incident light may be blocked by the first optical layer OPL1.

The second hole H2 of the transmission area PEA may be defined in the pixel defining layer PDL of the display element layer OL. When viewed from a plane, the area of the second hole H2 may be larger than the area of the first hole H1. The second hole H2 may penetrate through the pixel defining layer PDL in the thickness direction (e.g., the third direction DR3).

The second hole H2 may include a first opening OP1 and a second opening OP2. The first opening OP1 may correspond to a lower opening of the second hole H2, and the second opening OP2 may correspond to an upper opening of the second hole H2. The width of the second opening OP2 may be greater than the width of the first opening OP1. The width of the second hole H2 may gradually increase from the first opening OP1 to the second opening OP2. In this case, the cross section of the second hole H2 may have a trapezoidal shape.

An optically transparent material may be filled in the second hole H2. For example, the second electrode CE may be disposed on the inner side of the pixel defining layer PDL that defines the second hole H2 and may be disposed on the circuit element layer CL in the second hole H2. The second electrode CE may be optically transparent. For example, the second electrode CE may include indium tin oxide (ITO). The second hole H2 may be further filled with an inorganic layer or an organic layer of the thin film encapsulation layer TFE that may be optically transparent. A portion of the second electrode CE that overlaps the second hole H2 may be removed in some embodiments.

Some of the external light incident onto the display element layer OL through the thin film encapsulation layer TFE may reach the circuit element layer CL through the second hole H2, and the rest of the incident light may be blocked by the pixel defining layer PDL and/or the first electrode AE.

In the display panel DP, the layers except for the pixel defining layer PDL, the first optical layer OPL1, and the wires SNL1 and SNL2 include a transparent material, and the external light may reach under the display panel DP through the transmission area PEA in which the first hole H1 and the second hole H2 are defined. External light passing through the display panel DP may reach the sensor SS.

FIGS. 9B to 9F are cross-sectional views illustrating display panels of the display device DD according to some embodiments. The display panel DP shown in FIG. 9A may have a structure of any one of display panels DP2 to DP6 that are shown in FIGS. 9B to 9F or any combination thereof.

As shown in FIGS. 9B to 9F, transmission areas PEA2 to PEA6 may be defined to correspond to the transmission area PEA shown in FIG. 8.

Figure 9B:
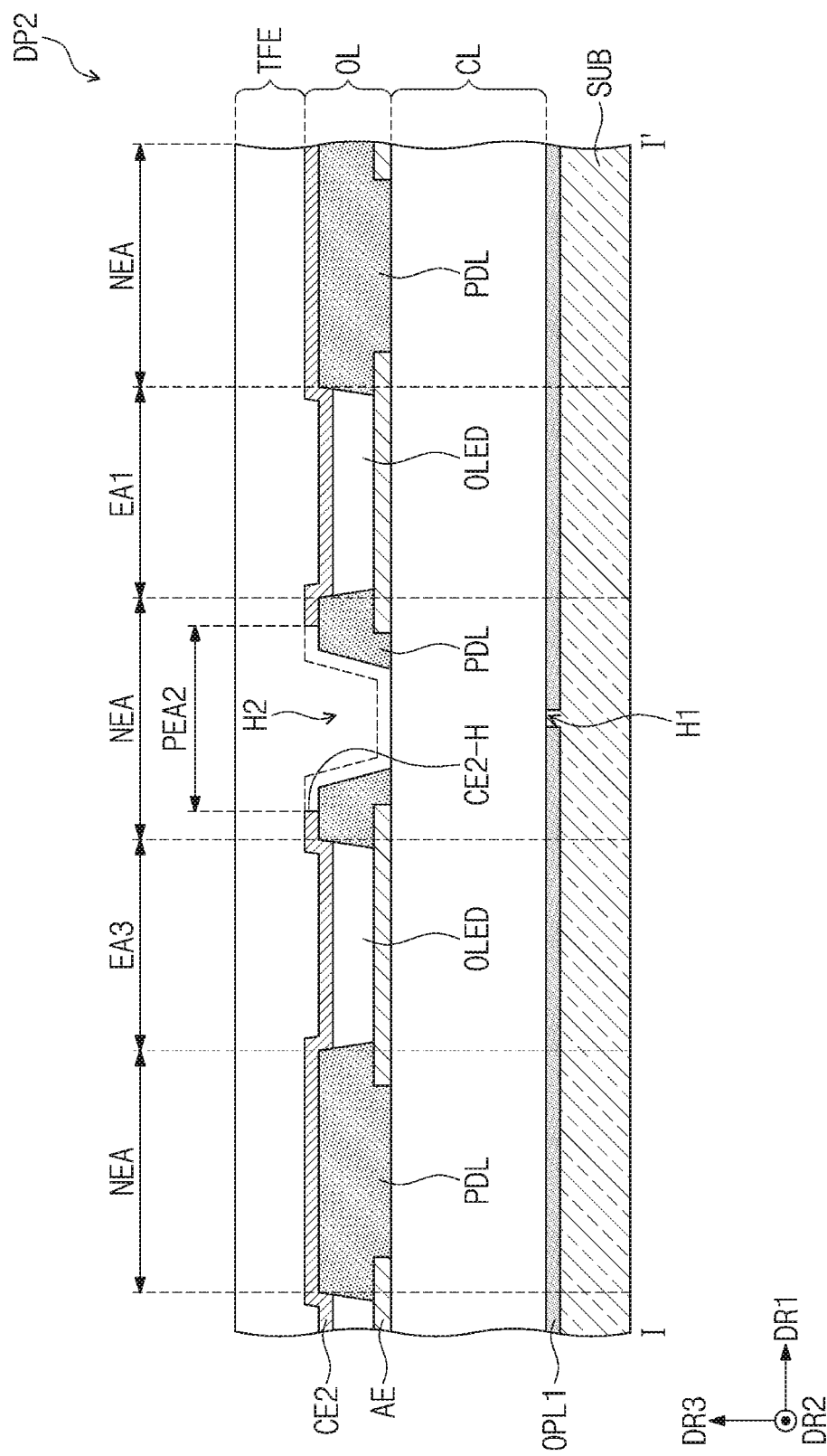
FIGS. 9B, 9C, 9D, 9E, and 9F are cross-sectional views illustrating display panels of a display device according to some embodiments.

Referring to FIG. 9B, the display panel DP2 includes a second electrode CE2, and a portion of the second electrode CE2 that overlaps the transmission area PEA2 may be removed. A hole CE2-H may be defined in the second electrode CE2. The hole CE2-H may penetrate through the second electrode CE2 in the third direction DR3. An organic layer or an inorganic layer of the thin film encapsulation layer TFE may be filled in the second hole CE2-H of the second electrode CE2.

The display panel DP2 may include a plurality of holes CE2-H that are defined in the second electrode CE2. For example, when viewed from a plane, a plurality of second holes CE2-H may be defined in the transmission areas PEA2.

The second electrode CE2 that is not disposed in the transmission area PEA2 may increase the light transmittance of the transmission area PEA2 compared to the transmission area PEA shown in FIG. 9A.

Figure 9C:
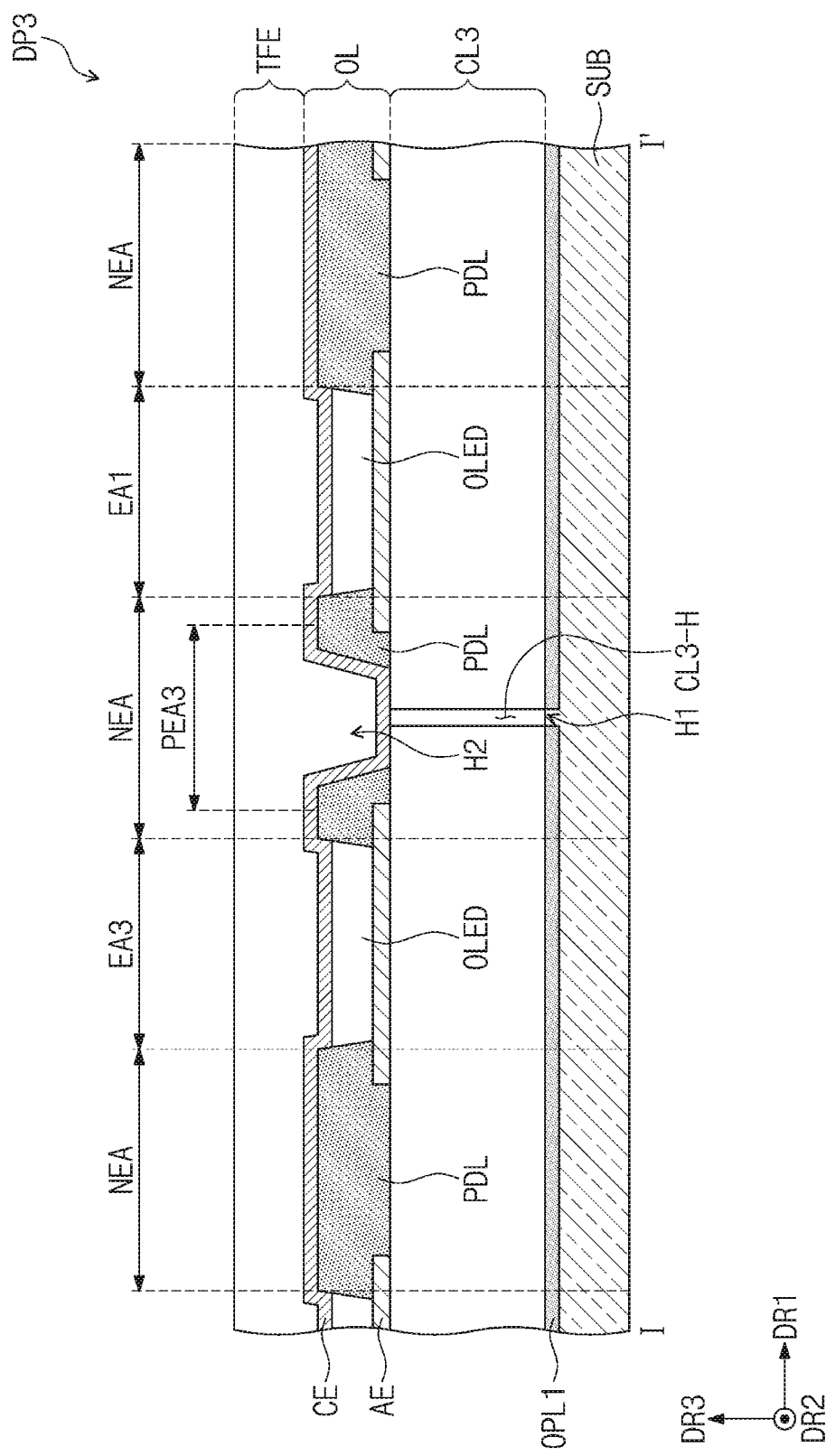

Referring to FIG. 9C, the display panel DP3 include a circuit element layer CL3, and a hole CL3-H may be defined in the circuit element layer CL3. The circuit element layer CL3 may have the same layer structure as the circuit element layer CL shown in FIG. 4 and FIG. 9A. The hole CL3-H may penetrate through the circuit element layer CL3. In other words, the hole CL3-H may be defined in each of the layers of the circuit element layer CL3.

The hole CL3-H may overlap the transmission area PEA3. More specifically, the hole CL3-H may overlap the first hole H1. In FIG. 9C, it is shown that the hole CL3-H has the same width as the first hole H1, but this is only an example, and the width of the hole CL3-H of the circuit element layer CL3 is not limited thereto. For example, when viewed from a plane, the hole CL3-H may have the same width as the transmission area PEA3.

In FIG. 9C, it is shown that the hole CL3-H penetrates through the circuit element layer CL3 between the pixel defining layer PDL and the first optical layer OPL1, but the embodiment of the inventive concept is not limited thereto. For example, at least one of the first to sixth insulating layers 10 to 60 in the circuit element layer CL3 may have an opening corresponding to the hole CL3-H, and one or more of the first to sixth insulating layers 10 to 60 in the circuit element layer CL3 may not have an opening corresponding to the hole CL3-H.

Due to the hole CL3-H defined in the circuit element layer CL3, the transmission area PEA3 of the display panel DP3 may have a higher light transmittance than the transmission area PEA shown in FIG. 9A.

Figure 9D:
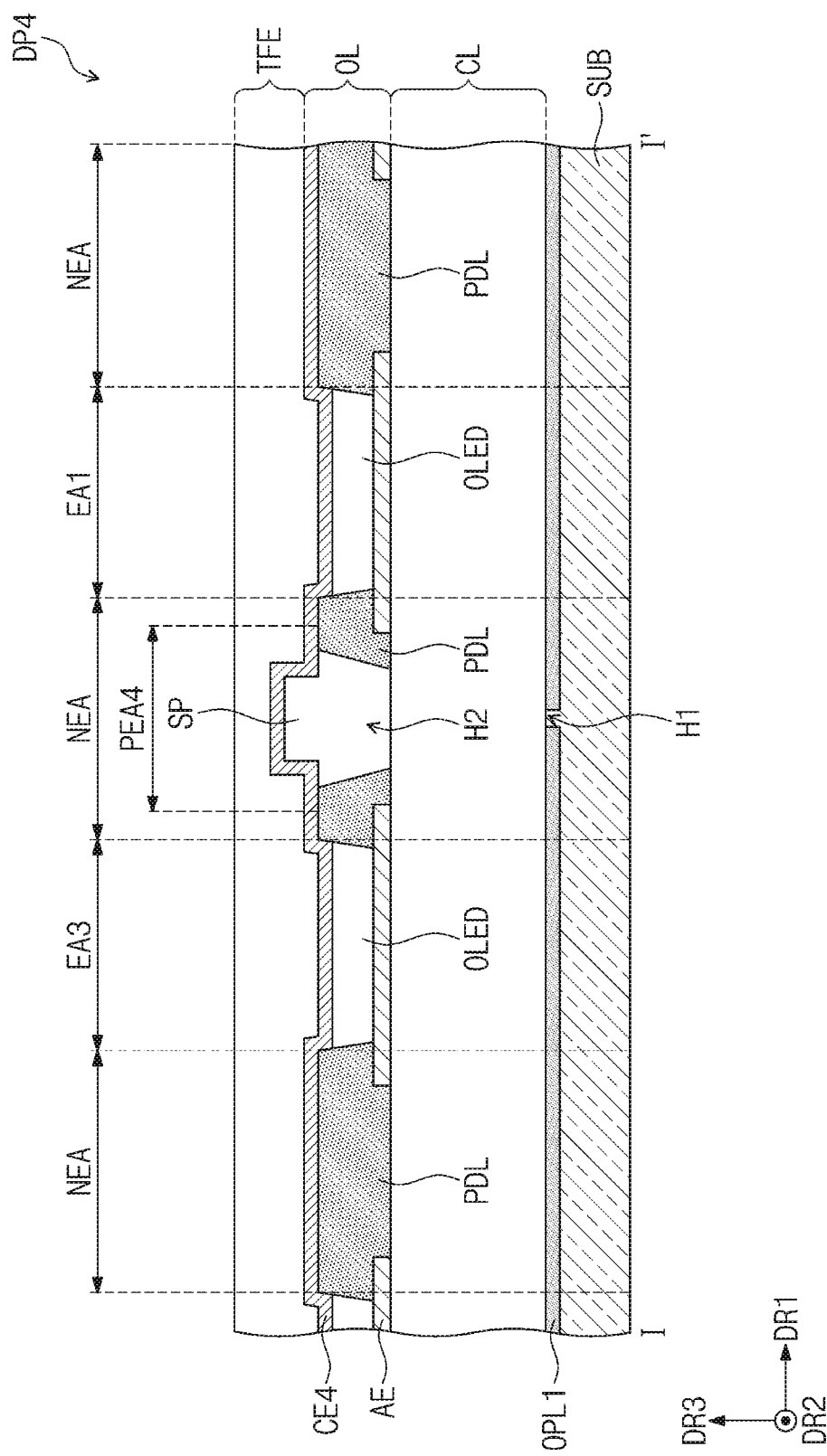

Referring to FIG. 9D, the display panel DP4 may further include a spacer SR that is disposed on the pixel defining layer PDL. The spacer SR may include a transparent material. For example, the spacer SR may include a transparent organic insulating material. The spacer SR may overlap the transmission area PEA4. In this case, the second hole H2 may be filled with the transparent insulating material of the spacer SR. A second electrode CE4 that overlaps the transmission area PEA4 may be disposed on the spacer SR.

The spacer SR may protect the light emitting elements OLED and the circuit element layer CL and prevent deterioration of display characteristics of the display panel DP4. For example, the spacer SR may serve as a buffer to protect the light emitting elements OLED from an external force acting thereon.

The spacers SR included in the display panel DP4 may provide flexibility to respond to and absorb an impact from a force acting on the display panel DP4 compared to the display panel DP shown in FIG. 9A.

Figure 9E:
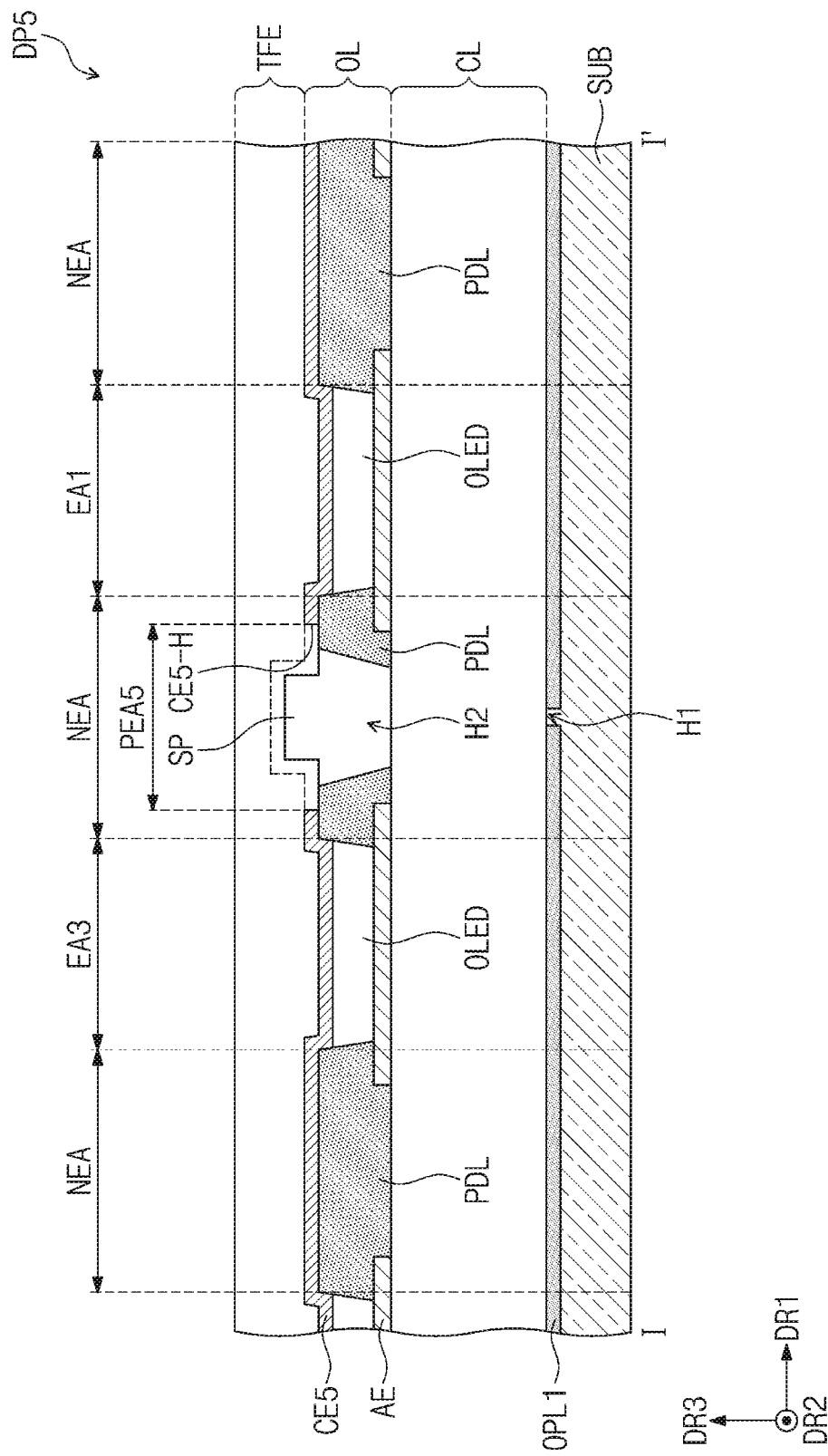

Referring to FIG. 9E, the display panel DP5 includes a second electrode CE5 and the spacer SR, and a portion of the second electrode CE5 that overlaps the transmission area PEA5 may be removed. More specifically, a hole CE5-H may be defined in the second electrode CE5. The hole CE5-H may overlap the spacer SR and a portion of the second electrode CE5 adjacent to the spacer SR. The hole CE5-H may be filled with the thin film encapsulation layer TFE.

The second electrode CE5 that is not disposed in the transmission area PEA5 may further increase the light transmittance of the transmission area PEA5 compared to the transmission area PEA4 shown in FIG. 9D.

Figure 9F:
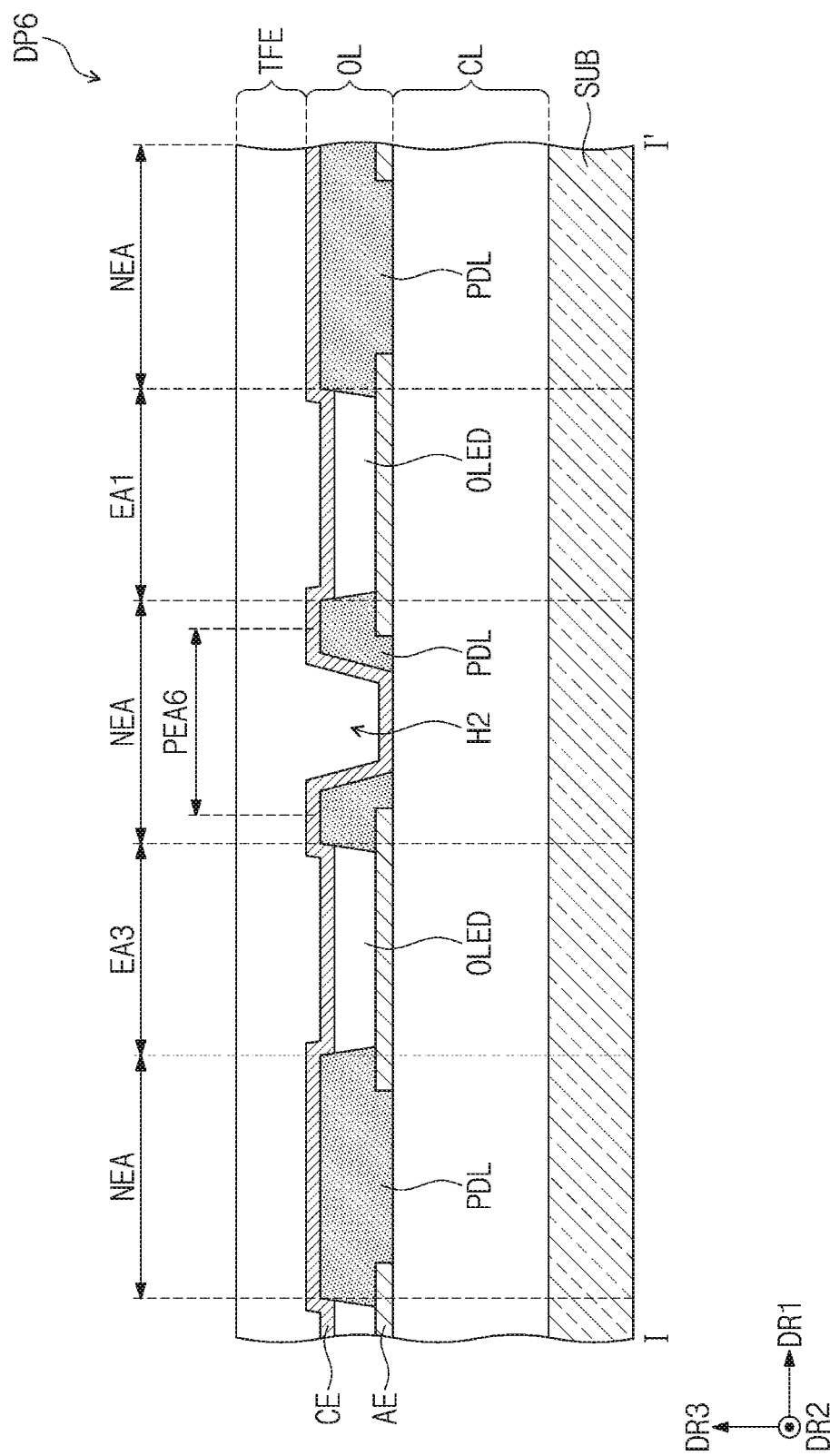

Referring to FIG. 9F, the display panel DP6 may not include the first optical layer OPL1 shown in FIG. 9A. In this case, the display device DD may include only the second optical layer OPL2 shown in FIG. 4. In this embodiment, the display panel DP6 may include the second hole H2 in the transmission area PEA6 but may have no first hole H1.

Due to omission of the first optical layer OPL1 the display panel DP6 may be thinner than the display panel DP shown in FIG. 9A.

As described above, the display panel DP shown in FIG. 9A may be changed to any one of the display panels DP2, DP3, DP4, DP5, and DP6 shown in FIGS. 9B to 9F without deviating from the scope of the present disclosure.

Further, the display panel DP shown in FIG. 9A may be changed to a structure in which at least two display panels among the display panels DP2, DP3, DP4, DP5, and DP6 shown in FIGS. 9B to 9F may be combined.

For example, the display panel DP shown in FIG. 9A may have a structure in which the display panel DP2 shown in FIG. 9B, the display panel DP3 shown in FIG. 9C, and the display panel DP6 shown in FIG. 9F are combined. In this case, in the display panel DP, a portion of the second electrode CE overlapping the transmission area PEA may be removed, a hole overlapping the transmission area PEA may be defined in the circuit element layer CL, and the first optical layer OPL1 shown in FIG. 9A may be omitted.

According to an embodiment in which the display device DD includes the first optical layer OPL1 that is disposed inside the display panel DP, as shown in FIGS. 9A to 9E, the second optical layer OPL2 shown in FIG. 4 may be omitted. In this case, the sensor SS may be attached to the display panel DP using the adhesive layer AL without having the second optical layer OPL2 therebetween.

Figure 10:
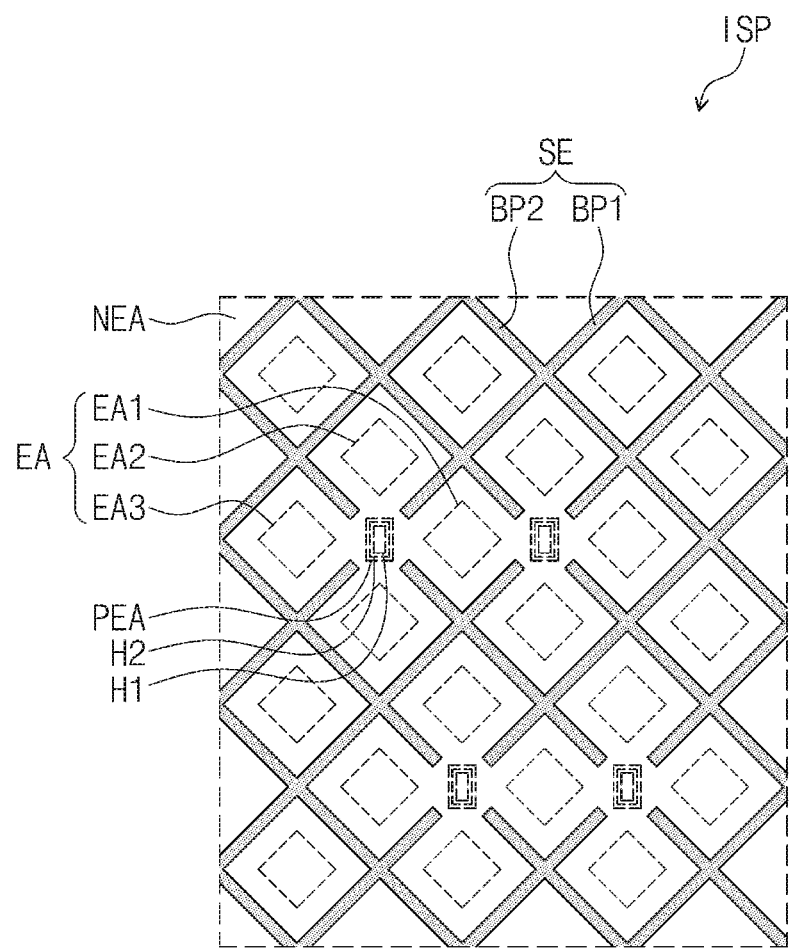
FIG. 10 is a plan view illustrating a first area of the input detection part shown in FIG. 7.

FIG. 10 is a plan view illustrating the first area AE1 of the input detection part ISP shown in FIG. 7.

Referring to FIG. 10, a detection electrode SE may include a plurality of first branches BP1 and a plurality of second branches BP2. The detection electrode SE may be any one of the first detection electrode SE1 and the second detection electrode SE2 shown in FIG. 5.

The first branches BP1 and the second branches BP2 may be disposed to cross each other. For example, each of the first branches BP1 may extend in the fourth direction DR4. The first branches BP may be spaced apart from each other in the fifth direction DR5. Each of the second branches BP2 may extend in the fifth direction DR5. The second branches BP2 may be spaced apart from each other in the fourth direction DR4.

The detection electrode SE may surround the first, second, and third emission areas EA1, EA2, and EA3. For example, the first branches BP1 and the second branches BP2 may be disposed in the non-emission area NEA that is adjacent to the first, second, and third emission areas EA1, EA2, and EA3. The first branches BP1 and the second branches BP2 may be arranged in a mesh shape to surround each of the first, second, and third emission areas EA1, EA2, and EA3.

A portion of the detection electrode SE that overlaps the transmission area PEA may be removed. Specifically, the detection electrode SE may not overlap the first hole H1 and the second hole H2 of the transmission area PEA. For example, the first branches BP1 and the second branches BP2 may not be disposed in a portion overlapping the transmission area PEA. Accordingly, light transmittance of the transmission area PEA may be increased.

Figure 11:
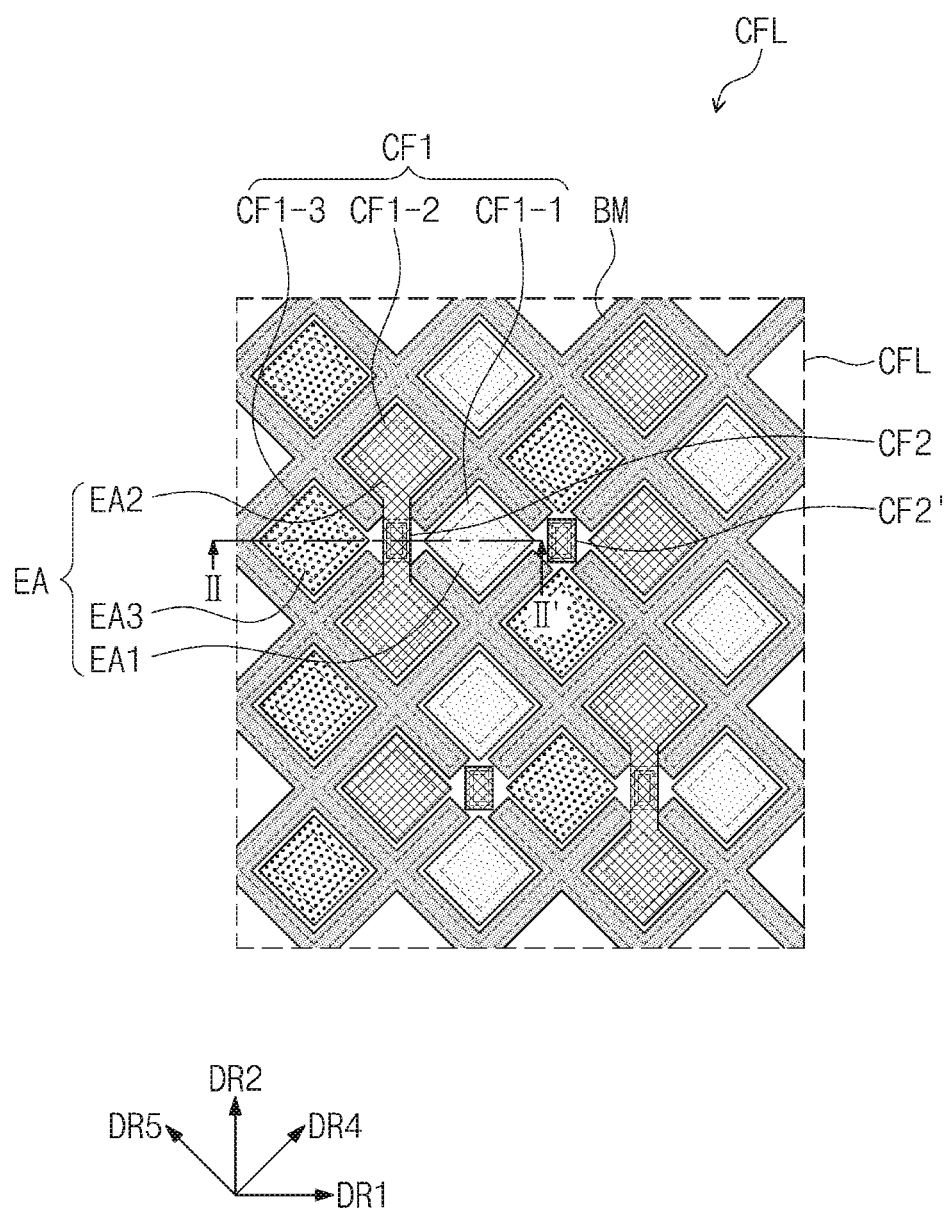
FIG. 11 is a plan view showing a first area of a color filter layer shown in FIG. 7.

FIG. 11 is a plan view showing a first area of the color filter layer CFL shown in FIG. 7. For convenience of explanation, in FIG. 11, the input detection part ISP and the display panel DP that are disposed under the color filter layer CFL are illustrated using dotted lines.

Referring to FIGS. 10 and 11, the color filter layer CFL may include a first color filter CF1, a black matrix BM, and second color filters CF2 and CF2'. The first color filter CF1 may overlap the first, second, and third emission areas EA1, EA2, and EA3. Specifically, the first color filter CF1 may include a plurality of first filters CF1-1, a plurality of second filters CF1-2, and a plurality of third filters CF1-3.

The first filter CF1-1 may overlap the first emission area EA1, the second filter CF1-2 may overlap the second emission area EA2, and the third filter CF1-3 may overlap the third emission area EA3. The first, second, and third filters CF1-1, CF1-2, and CF1-3 may have the substantially same shape as the corresponding first, second, and third emission areas EA1, EA2, and EA3. For example, each of the first, second, and third filters CF1-1, CF1-2, and CF1-3 may have a rhombus shape. However, the shapes of the first, second, and third filters CF1-1, CF1-2, and CF1-3 are not limited thereto.

According to an embodiment, the first filter CF1-1 may be a red color filter, the second filter CF1-2 may be a green color filter, and the third filter CF1-3 may be a blue color filter. However, the first, second, and third filters CF1-1, CF1-2, and CF1-3 are not limited thereto. Colors of the first, second, and third filters CF1-1, CF1-2, and CF1-3 may vary according to the colors implemented by the corresponding first, second, and third emission areas EA1, EA2, and EA3.

The arrangement of color filters is merely an example, and in another embodiment, the red and blue color filters may be alternately disposed in an (N−1)-th row, the green color filter may be placed in an N-th column, and the blue and red color filters may be alternately disposed in an (N+1)-th column. N is a natural number.

When viewed from a plane, the area of the first color filter CF1 may be larger than the area of the emission area EA disposed under the first color filter CF1. Specifically, the area of the first filter CF1-1 may be larger than the area of the first emission area EA1, the area of the second filter CF1-2 may be larger than the area of the second emission area EA2, and the area of the third filter CF1-3 may be larger than the area of the third emission area EA3.

The black matrix BM may be disposed between adjacent ones of the first color filters CF1. The black matrix BM may overlap the non-emission area NEA. For example, the black matrix BM may overlap the pixel defining layer PDL. Specifically, the black matrix BM may be disposed along the fourth direction DR4 or the fifth direction DR5. The black matrix BM may be disposed on the detection electrode SE. When viewed from a plane, the area of the black matrix BM may be larger than the area of the detection electrode SE.

The black matrix BM may block light. For example, the black matrix BM may block external light incident onto the input detection part ISP. Accordingly, the detection electrode SE of the input detection part ISP may not be visually recognized to a user.

Each of the second color filters CF2 and CF2' may be disposed between adjacent ones of the first, second, and third filters CF1-1, CF1-2, and CF1-3 to overlap the transmission area PEA (refer to FIG. 10). When viewed from a plane, each of the second color filters CF2 and CF2' may have a rectangular shape. The area of the second color filters CF2 and CF2' may be larger than the area of the second hole H2 (refer to FIG. 10) that is disposed below the second color filters CF2 and CF2'.

The second color filters CF2 and CF2' may be color filters having the same color as any one of the first, second, and third filters CF1-1, CF1-2, and CF1-3. For example, the second color filters CF2 and CF2' may be green color filters (e.g., the second filter CF1-2). However, the color of the second color filters CF2 and CF2' is not limited thereto.

The second color filter CF2 may extend from the first color filter CF1. As shown in FIG. 11, the second color filter CF2 may extend from adjacent second filters CF1-2. In addition, as shown in FIG. 11, the second color filter CF2' may be disposed separately from the second filter CF1-2 that is adjacent thereto.

Figure 12:
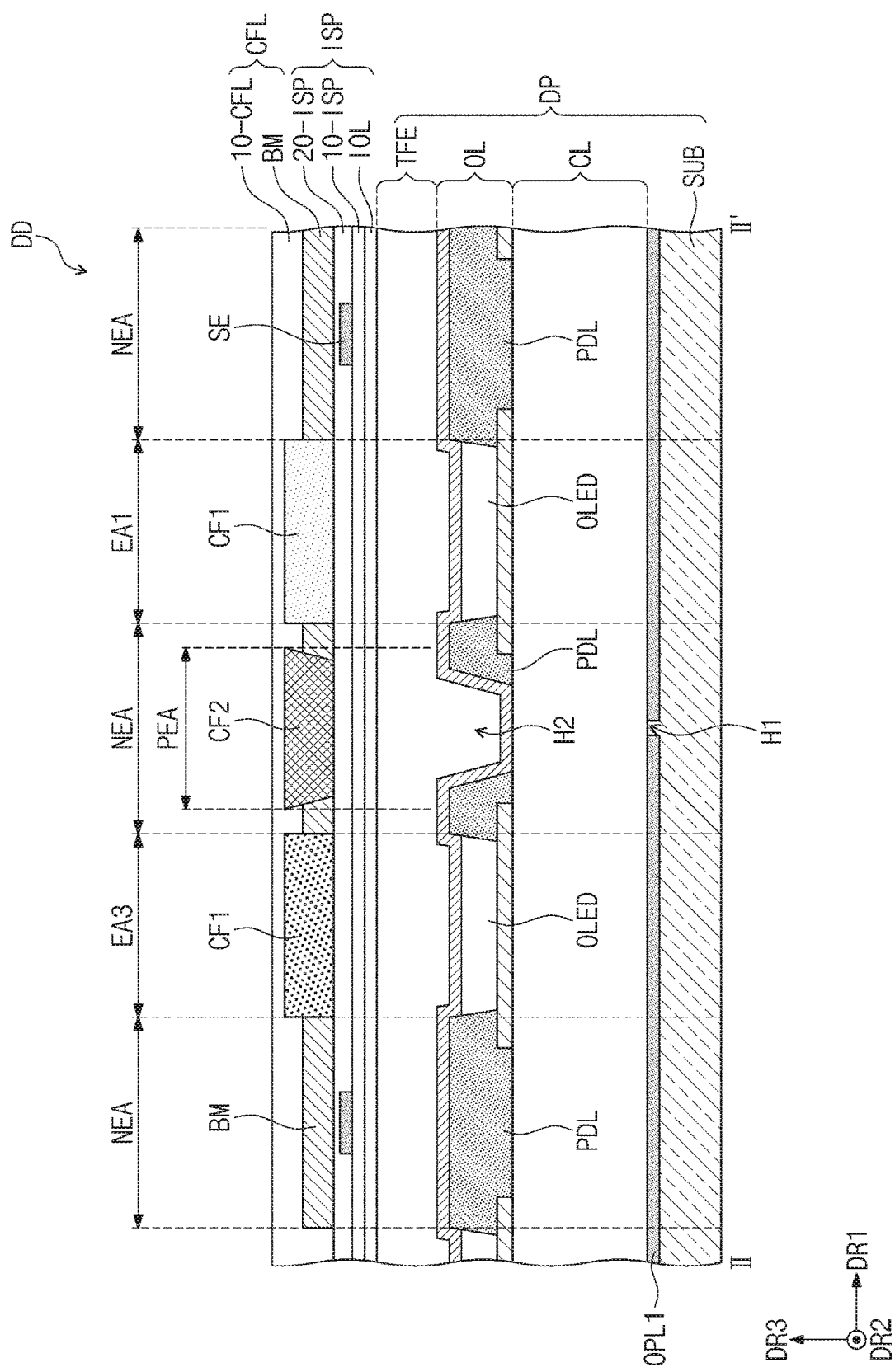
FIG. 12 is a cross-sectional view taken along the line II-II' shown in FIG. 11.

FIG. 12 is a cross-sectional view taken along the line II-II' shown in FIG. 11.

Referring to FIG. 12, the detection electrode SE of the input detection part ISP may not be disposed in the transmission area PEA, but the second color filter CF2 of the color filter layer CFL may be disposed in the transmission area PEA. The cross section of the second color filter CF2 may have a trapezoidal shape. For example, the width of the upper surface of the second color filter CF2 may be greater than the width of the lower surface of the second color filter CF2. However, the shape of the second color filter CF2 is not limited thereto.

The color filter layer CFL may include the first color filter CF1, the black matrix BM, and an insulating layer 10-CFL that is disposed on the first color filter CF1, the second color filter CF2, and the black matrix BM. The upper surface of the insulating layer 10-CFL may be flat. The window WIN of FIG. 7 may be disposed on the insulating layer 10-CFL.

The transmission area PEA may have a higher light transmittance than the emission areas (e.g., the first emission area EA1 and the third emission area EA3) that is around the transmission area PEA and the non-emission area NEA. Specifically, since the first hole H1 defined in the first optical layer OPL1 and the second hole H2 defined in the pixel defining layer PDL are defined in the transmission area PEA, the light transmittance of the transmission area PEA may be higher than that of the surrounding areas. In addition, since the detection electrode SE of the input detection part ISP is not disposed in the transmission area PEA, and the second color filter CF2 is disposed instead of the black matrix BM of the color filter layer CFL, the light transmittance of the transmission area PEA may be further increased.

In FIG. 12, the display panel DP shown in FIG. 9A is illustrated as a non-limiting example. However, as described above, the structure of the display panel DP may be changed to any one of the display panels DP2 to DP6 illustrated in FIGS. 9B to 9F or a combined structure thereof without deviating from the scope of the inventive concept.

Figure 13:
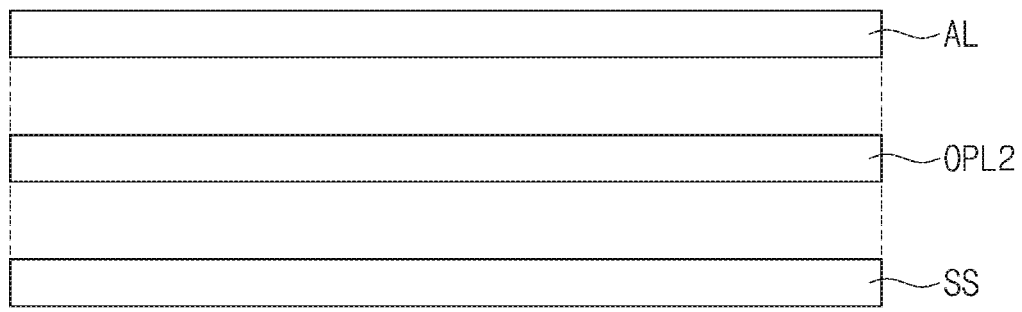
FIG. 13 is a cross-sectional view illustrating a sensor, a second optical layer, and an adhesive layer illustrated in FIG. 7 according to an embodiment.
Figure 13:
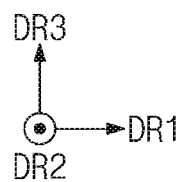
Figure 14:
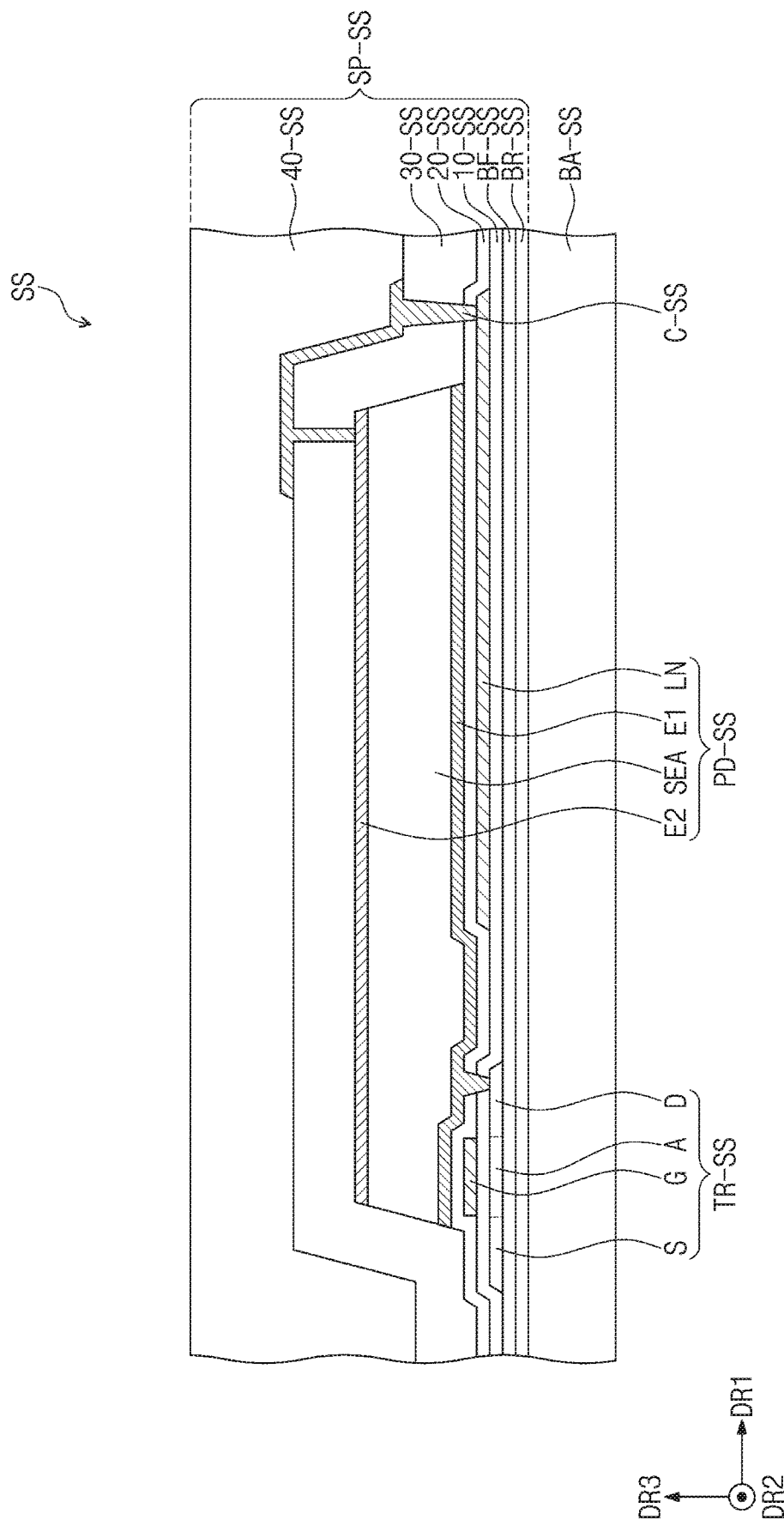
FIG. 14 is a cross-sectional view illustrating the sensor illustrated in FIG. 13 according to an embodiment.

FIG. 13 is a cross-sectional view illustrating the sensor SS, the second optical layer OPL2, and the adhesive layer AL illustrated in FIG. 7 according to an embodiment. FIG. 14 is a cross-sectional view illustrating the sensor SS illustrated in FIG. 13 according to an embodiment. The sensor SS of FIG. 14 may be provided in plurality.

The sensor SS may include a base part BA-SS and a detection part SP-SS that is disposed on the base part BA-SS. The base part BA-SS may include a substrate. For example, the base part BA-SS may include polyimide. The detection part SP-SS may include a barrier layer BR-SS, a buffer layer BF-SS, a transistor TR-SS, a detection element PD-SS, and a plurality of insulating layers including a first insulting layer 10-SS, a second insulting layer 20-SS, a third insulting layer 30-SS, and a fourth insulting layer 40-SS.

The barrier layer BR-SS may be disposed on the base part BA-SS. The buffer layer BF-SS may be disposed on the barrier layer BR-SS. The buffer layer BF-SS may be the same as the buffer layer BFL illustrated in FIG. 4.

The transistor TR-SS may be disposed on the buffer layer BF-SS. The transistor TR-SS may include an active region A, a source S, a drain D, and a gate G. The first insulating layer 10-SS may be disposed on the buffer layer BF-SS and may cover the active region A, the source S, and the drain D of the transistor TR-SS. The first insulating layer 10-SS may include an organic layer, and may have a single layer or a multilayer structure. For example, the first insulating layer 10-SS may be a single-layer silicon oxide layer.

The gate G and a wire layer LN may be disposed on the first insulating layer 10-SS. A predetermined voltage (e.g., a bias voltage) may be applied to the wire layer LN. The wire layer LN may include the detection element PD-SS or may be electrically connected to the detection element PD-SS.

The second insulating layer 20-SS may be disposed on the first insulating layer 10-SS and may cover the gate G of the transistor TR-SS and the wire layer LN. The second insulating layer 20-SS may include an inorganic layer, and may have a single layer or a multilayer structure. For example, the second insulating layer 20-SS may be a single layer of silicon oxide.

The detection element PD-SS may be disposed on the second insulating layer 20-SS. The detection element PD-SS may be electrically connected to the transistor TR-SS and the wire layer LN. For example, the operation of the detection element PD-SS may be controlled by a signal provided from the transistor TR-SS, and the predetermined voltage applied to the wire layer LN.

Specifically, the detection element PD-SS may include a first detection electrode E1, a detection layer SEA, and a second detection electrode E2. However, the inventive concept is not limited thereto, and the detection element PD-SS may have a different structure and/or different layers.

The first detection electrode E1 may be electrically connected to the drain D of the transistor TR-SS via a contact hole that passes through the first and second insulating layers 10-SS and 20-SS. The first detection electrode E1 may include an opaque conductive material. For example, the first detection electrode E1 may include molybdenum. However, the material of the first detection electrode E1 is not limited thereto.

The detection layer SEA may be disposed on the first detection electrode E1. The detection layer SEA may include amorphous silicon.

The second detection electrode E2 may be disposed on the detection layer SEA. The second detection electrode E2 may include a transparent material. For example, the second detection electrode E2 may include indium tin oxide (ITO).

The third insulating layer 30-SS may be disposed on the second detection electrode E2. The third insulating layer 30-SS may include an inorganic layer, and may have a single layer or a multilayer structure. For example, the third insulating layer 30-SS may include a silicon oxide layer and a silicon nitride layer.

A connection electrode C-SS may be disposed on the third insulating layer 30-SS. The connection electrode C-SS may be electrically connected to the second detection electrode E2 via a contact hole that passes through the third insulating layer 30-SS. In addition, the connection electrode C-SS may be electrically connected to the wire layer LN via another contact hole that passes through the second and third insulating layers 20-SS and 30-SS.

The fourth insulating layer 40-SS may be disposed on the third insulating layer 30-SS and may cover the connection electrode C-SS. The fourth insulating layer 40-SS may include an organic layer, and may have a single layer or a multilayer structure. For example, the fourth insulating layer 40-SS may be a single-layer polyimide resin layer. The upper surface of the fourth insulating layer 40-SS may be flat.

Figure 15:
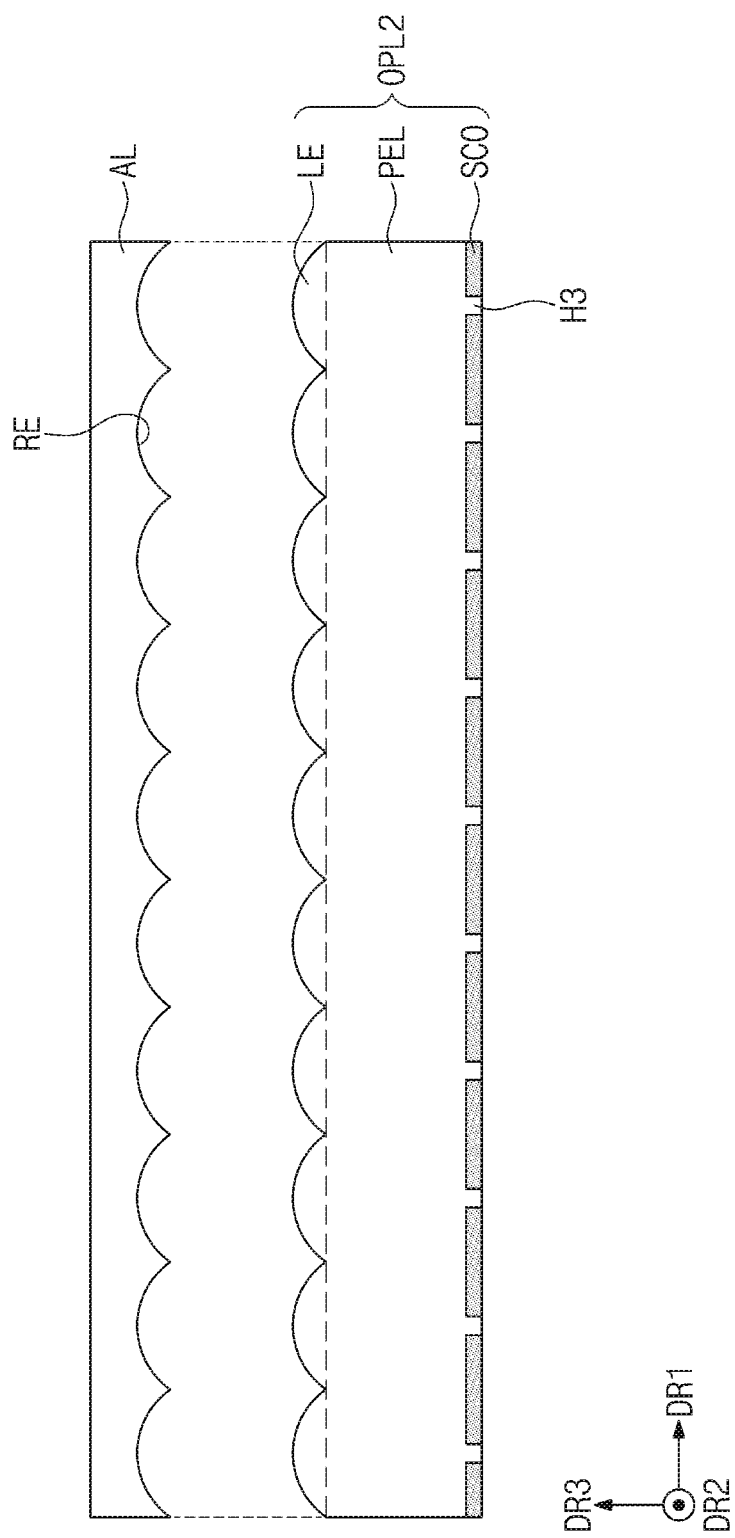
FIG. 15 is a diagram illustrating an adhesive layer and a second optical layer illustrated in FIG. 13 according to an embodiment.

FIG. 15 is a diagram illustrating the adhesive layer AL and the second optical layer OPL2 illustrated in FIG. 13 according to an embodiment. As described above, in a case where the display device DD includes the first optical layer OPL1 disposed inside the display panels DP to DP5 (refer to FIGS. 9A to 9E), the second optical layer OPL2 may be omitted.

Referring to FIGS. 4, 13, and 15, the second optical layer OPL2 may be disposed between the sensor SS and the substrate SUB of the display panel DP. The second optical layer OPL2 may be optically transparent. Accordingly, external light incident from the display panel DP may reach the sensor SS through the second optical layer OPL2.

The second optical layer OPL2 may include a transmission layer PEL, a plurality of lenses LE, and a light blocking coating layer SCO. The transmission layer PEL may include a transparent material. For example, the transmission layer PEL may include a transparent organic material.

Each of the lenses LE may be a convex lens having a convex shape toward the upper part. The lenses LE may be disposed on an upper surface of the transmission layer PEL. The lenses LE may include the same material as the transmission layer PEL. For example, the lenses LE may include a transparent organic material. Each of the lenses LE may collect external light incident onto the second optical layer OPL2.

The light blocking coating layer SCO may be disposed on the lower surface of the second optical layer OPL2. The light blocking coating layer SCO may block light. For example, the light blocking coating layer SCO may have a black color. A plurality of third holes H3 may be defined in the light blocking coating layer SCO. The plurality of third holes H3 may overlap the transmission area PEA illustrated in FIG. 12.

External light reaching the upper surface of the second optical layer OPL2 may be concentrated toward the third hole H3 by the lens LE. The external light may reach the sensor SS (refer to FIG. 13) through the third hole H3.

The adhesive layer AL may be disposed between the second optical layer OPL2 and the substrate SUB of the display panel DP. The adhesive layer AL may couple the display panel DP and the second optical layer OPL2. The adhesive layer AL may be optically transparent and may have a lower refractive index than the second optical layer OPL2. For example, the adhesive layer AL may include at least one of an optical clear resin (OCR), an optical clear adhesive (OCA), and a pressure sensitive adhesive (PSA). However, the adhesive layer AL is not limited thereto.

A plurality of depressions RE may be formed on the lower surface of the adhesive layer AL. The shape of the depression part RE may correspond to the shape of the lens LE disposed on the upper surface of the optical layer OPL. For example, the depression part RE may have a concave shape toward the upper part conforming to the convex shape of the corresponding lens LE. The upper surface of the adhesive layer AL may be flat. For example, the upper surface of the adhesive layer AL may be substantially parallel to the lower surface of the substrate SUB.

Figure 16:
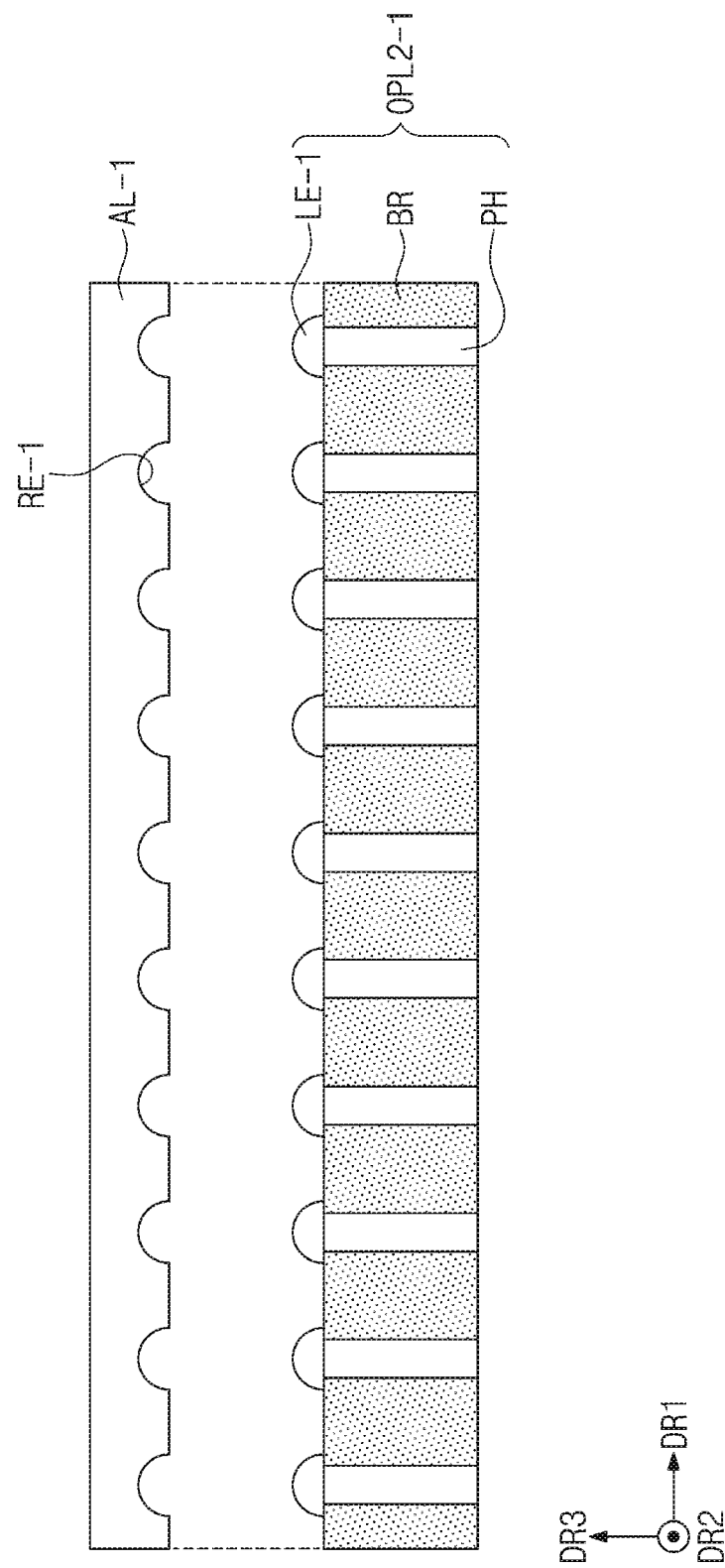
FIG. 16 is a diagram illustrating an adhesive layer and a second optical layer according to another embodiment.

FIG. 16 is a diagram illustrating an adhesive layer and a second optical layer according to another embodiment. An adhesive layer AL-1 and a second optical layer OPL2-1 illustrated in FIG. 16 may have structures that are different from those of the adhesive layer AL and the second optical layer OPL2 illustrated in FIG. 15.

Referring to FIG. 16, the optical layer OPL2-1 may include a collimator layer. Specifically, the second optical layer OPL2-1 may include a light blocking layer BR, a plurality of transmission holes PH, and a plurality of lenses LE-1.

The light blocking layer BR may absorb light. For example, the light blocking layer BR may be a colored layer. The light blocking layer BR may include a material in which light-absorbing particles are dispersed, or may be a layer in which a carbon-based pigment is mixed.

The transmission holes PH may be defined in the light blocking layer BR. For example, the transmission holes PH may have an opening part or a slit shape that penetrates through the light blocking layer BR in the thickness direction (e.g., the third direction DR3). The transmission holes PH may be optically transparent. Some of the transmission holes PH may overlap the transmission area PEA shown in FIGS. 10 and 12.

Each of the lenses LE-1 may be disposed on the transmission hole PH. The lens LE-1 may be a convex lens having a convex shape toward the upper part. The lenses LE-1 may be spaced apart from each other. For example, the lenses LE-1 may be spaced apart from each other in the first direction DR1.

A plurality of depression parts RE-1 corresponding to the lenses LE-1 may be defined on the lower surface of the adhesive layer AL-1. The depression parts RE-1 may be separated from each other. The upper surface of the adhesive layer AL-1 may be flat.

Figure 17:
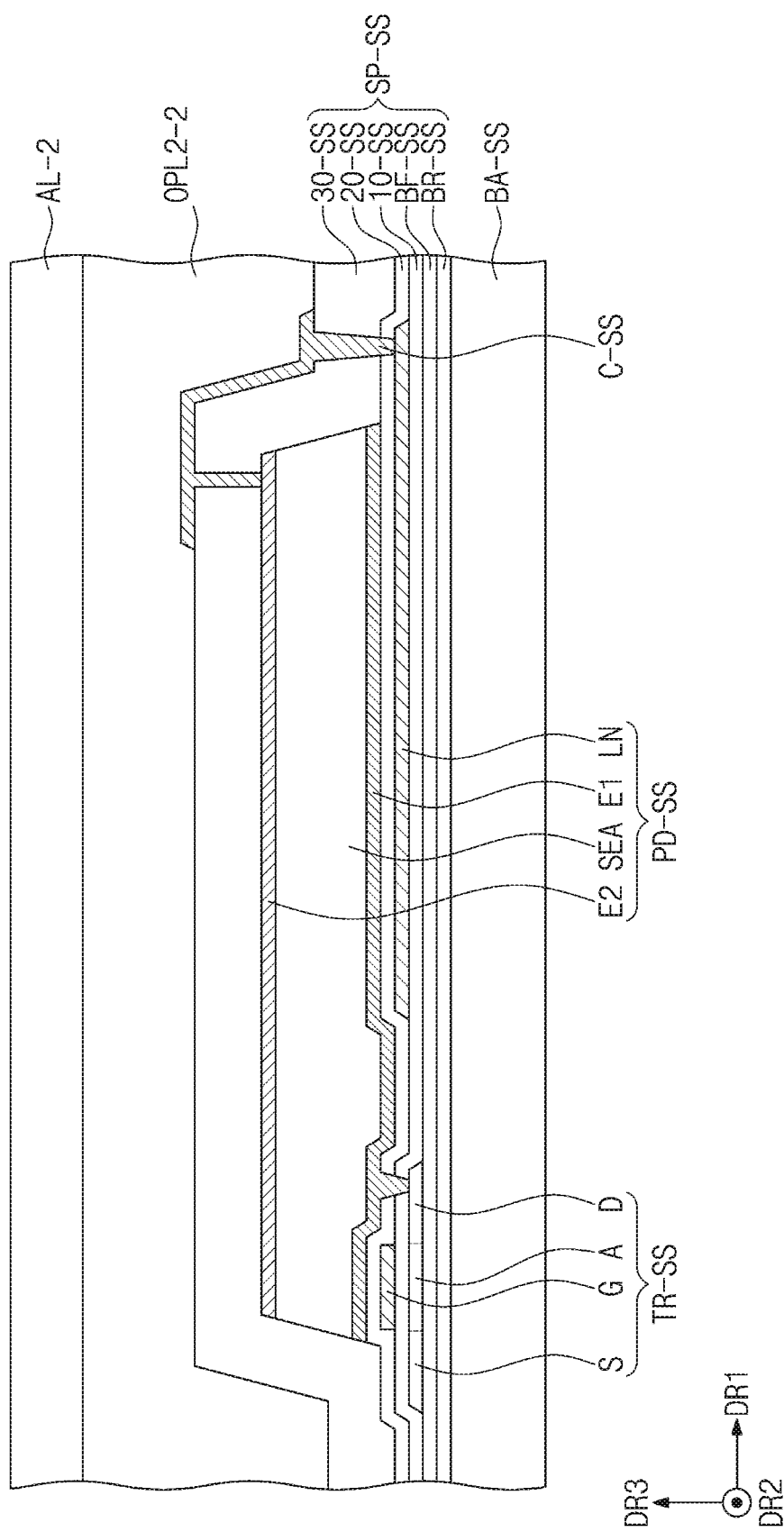
FIG. 17 is a diagram illustrating a sensor, a second optical layer, and an adhesive layer according to an embodiment.

FIG. 17 is a diagram illustrating a sensor, a second optical layer, and an adhesive layer according to an embodiment.

Referring to FIG. 17, a second optical layer OPL2-2 may be disposed on the third insulating layer 30-SS and the connection electrode C-SS, and the fourth insulating layer 40-SS of the sensor SS may be omitted. The lower part of the second optical layer OPL2-2 may be formed to correspond to the shape of the third insulating layer 30-SS and the connection electrode C-SS. An adhesive layer AL-2 may be disposed on the upper surface of the second optical layer OPL2-2. As the fourth insulating layer 40-SS is omitted, the overall thickness of the display device DD may be reduced.

Hereinafter, display devices according to other embodiments of the inventive concept will be described with reference to FIGS. 18 to 23. In the following drawings, the same reference numerals are used for the same components as those of the above-described embodiment(s). In the following description, the description of the same components will be omitted, and different components will be mainly described in detail.

For convenience of explanation, the illustrations of the adhesive layer AL, the second optical layer OPL2, and the sensor SS disposed under the display panel DP are omitted in the following drawings. As described above, the display device DD may include the optical layer OPL disposed on at least one of an inside of the display panel DP and an outside of the display panel DP. For example, the display device DD may include only the first optical layer OPL1 disposed inside the display panel DP, or only the second optical layer OPL2 disposed outside the display panel DP, or both the first optical layer OPL1 and the second optical layer OPL2.

Figure 18:
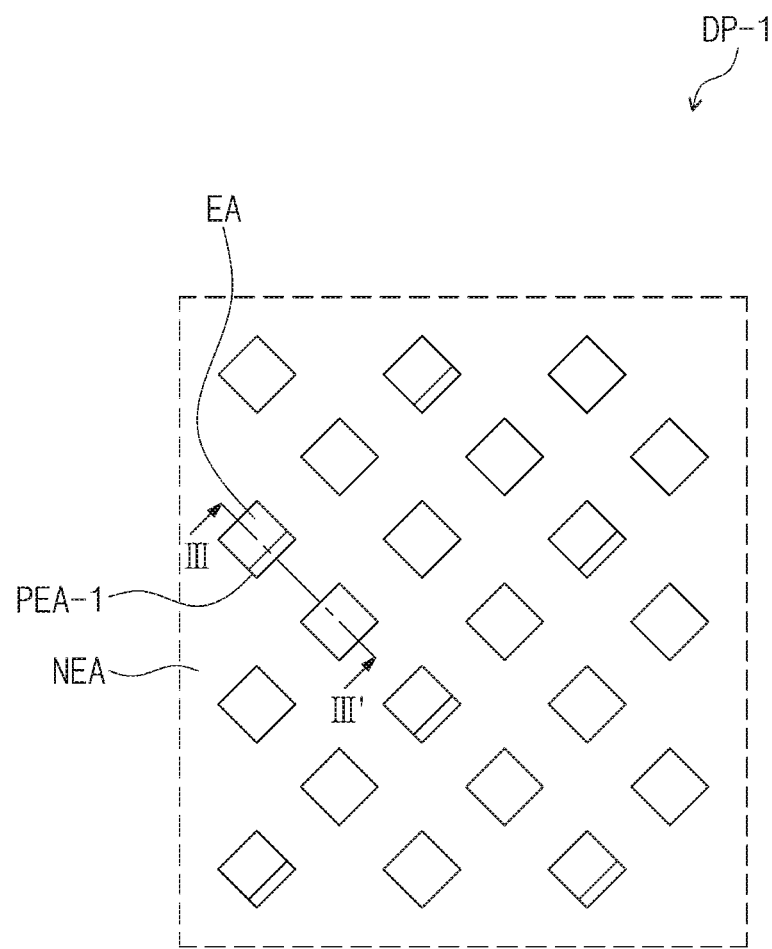
FIG. 18 is a plan view illustrating a display panel of a display device according to an embodiment.
Figure 19A:
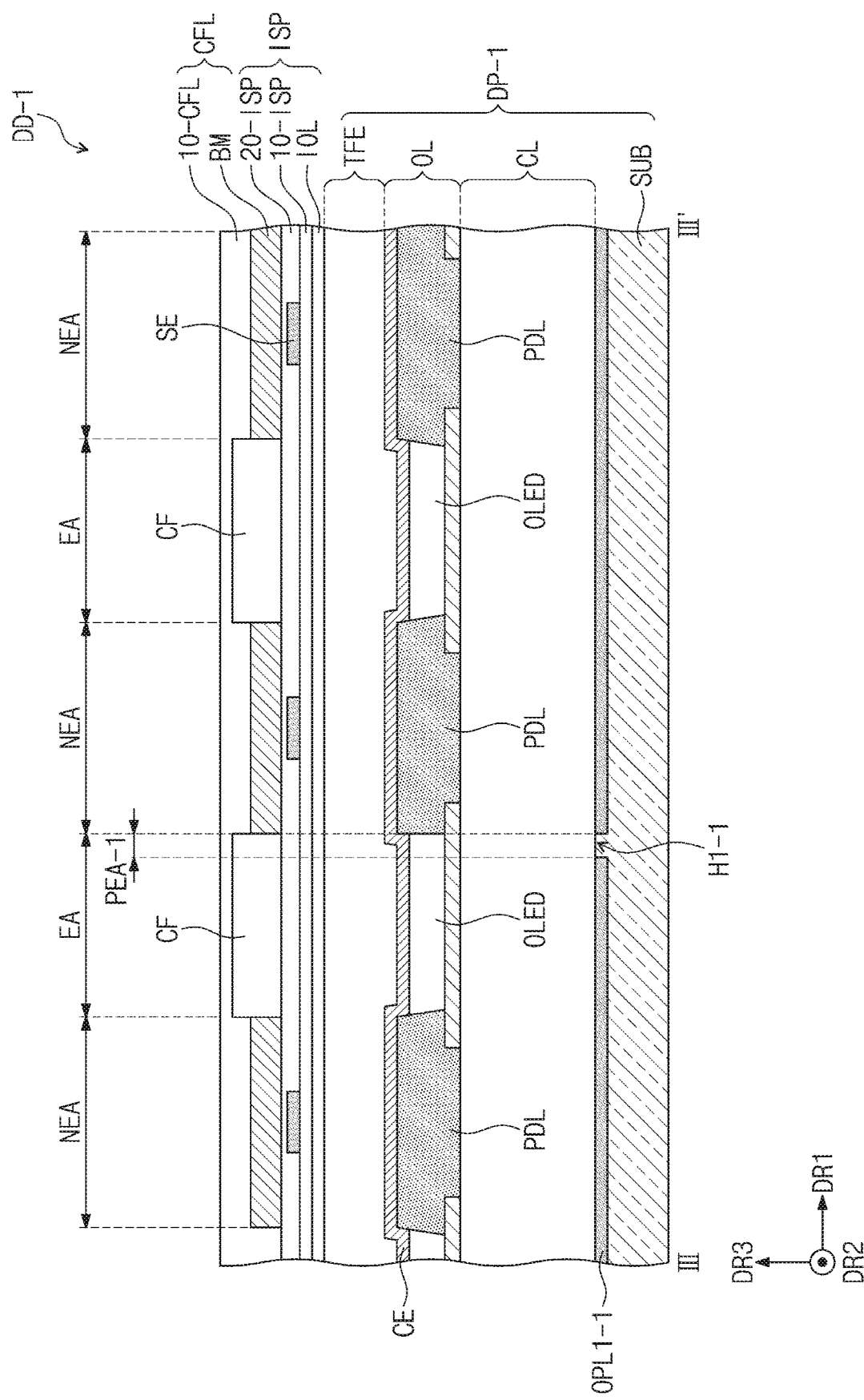
FIG. 19A is a cross-sectional view of the line III-III' shown in FIG. 18.

FIG. 18 is a plan view illustrating a display panel of the display device DD according to an embodiment. FIG. 19A is a cross-sectional view of the line III-III' shown in FIG. 18.

Referring to FIGS. 18 and 19A, a display panel DP-1 may include a plurality of emission areas EA, a non-emission area NEA, and a plurality of transmission areas PEA-1. The transmission areas PEA-1 may be defined in some of the emission areas EA. The emission area EA in which the transmission area PEA-1 is defined may implement one of red, green, and blue colors.

According to an embodiment, the transmission area PEA-1 may be defined at an edge of the emission area EA. For example, the transmission area PEA-1 may be disposed adjacent to one of the sides of the emission area EA. When viewed from a plane, the transmission area PEA-1 may have long sides extending in the fourth direction DR4 and short sides extending in the fifth direction DR5.

However, the transmission area PEA-1 are not limited thereto. For example, the transmission area PEA-1 may be formed in the center of the emission area EA. In another embodiment, the transmission area PEA-1 may have a circular shape when viewed from a plane.

A first hole H1-1 may be defined in the transmission area PEA-1. Specifically, the first hole H1-1 may be defined in the first optical layer OPL1-1 of the display panel DP-1. The circuit element layer CL, the light emitting element OLED of the display element layer OL, and the like may be disposed on the first hole H1-1.

Figure 19B:
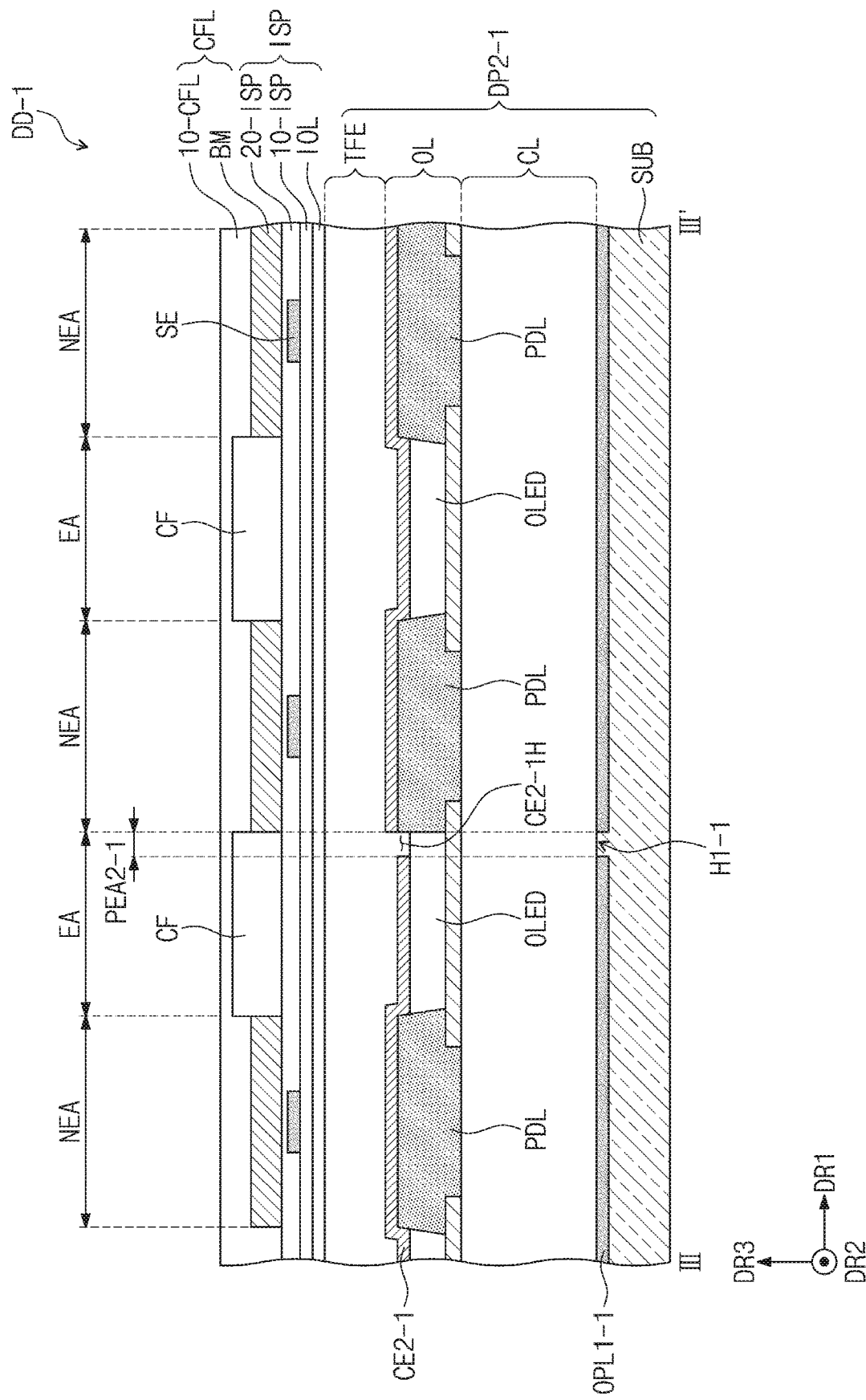
FIGS. 19B, 19C, and 19D are views illustrating display panels of a display device according to an embodiment.
Figure 19C:
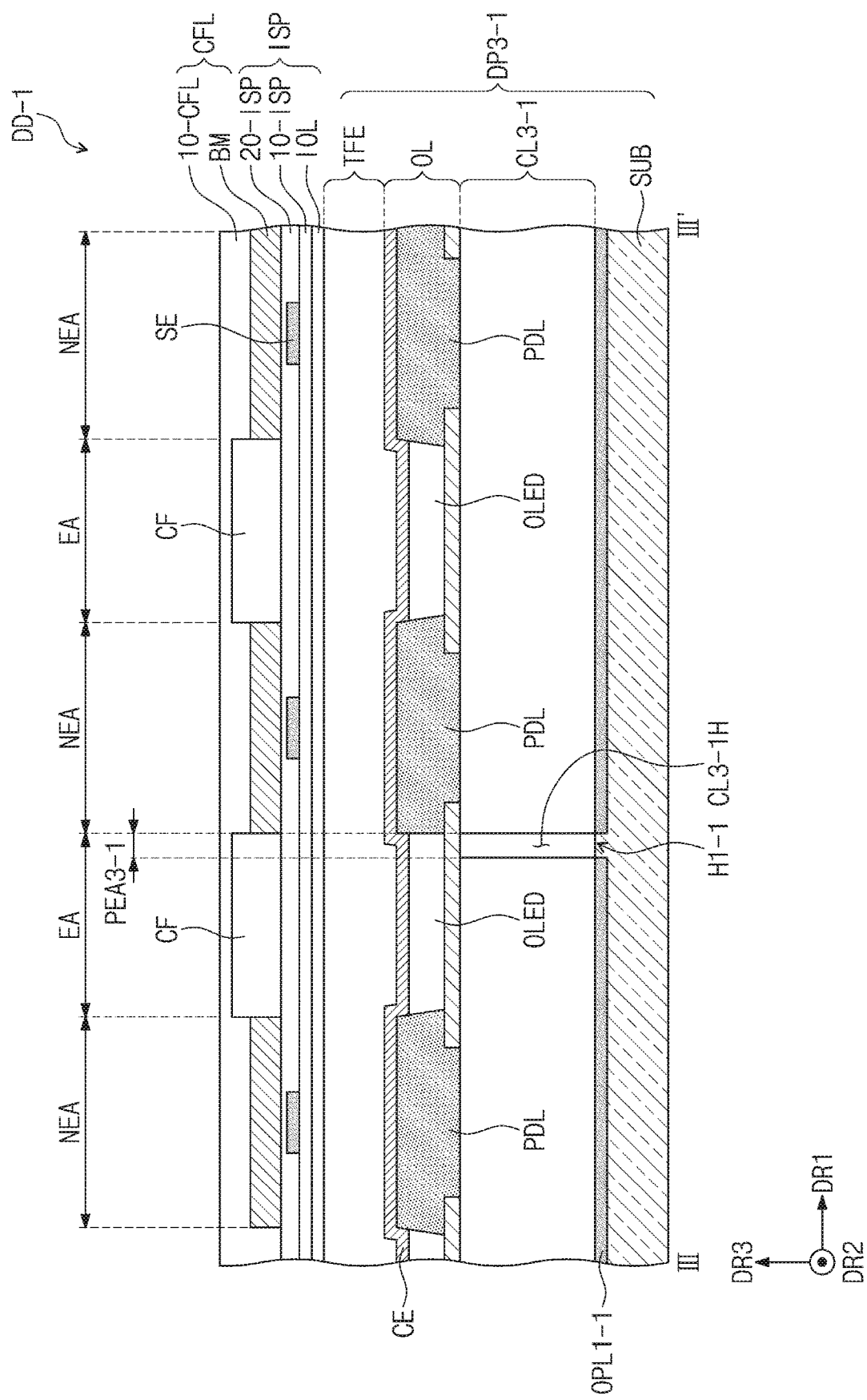
Figure 19D:
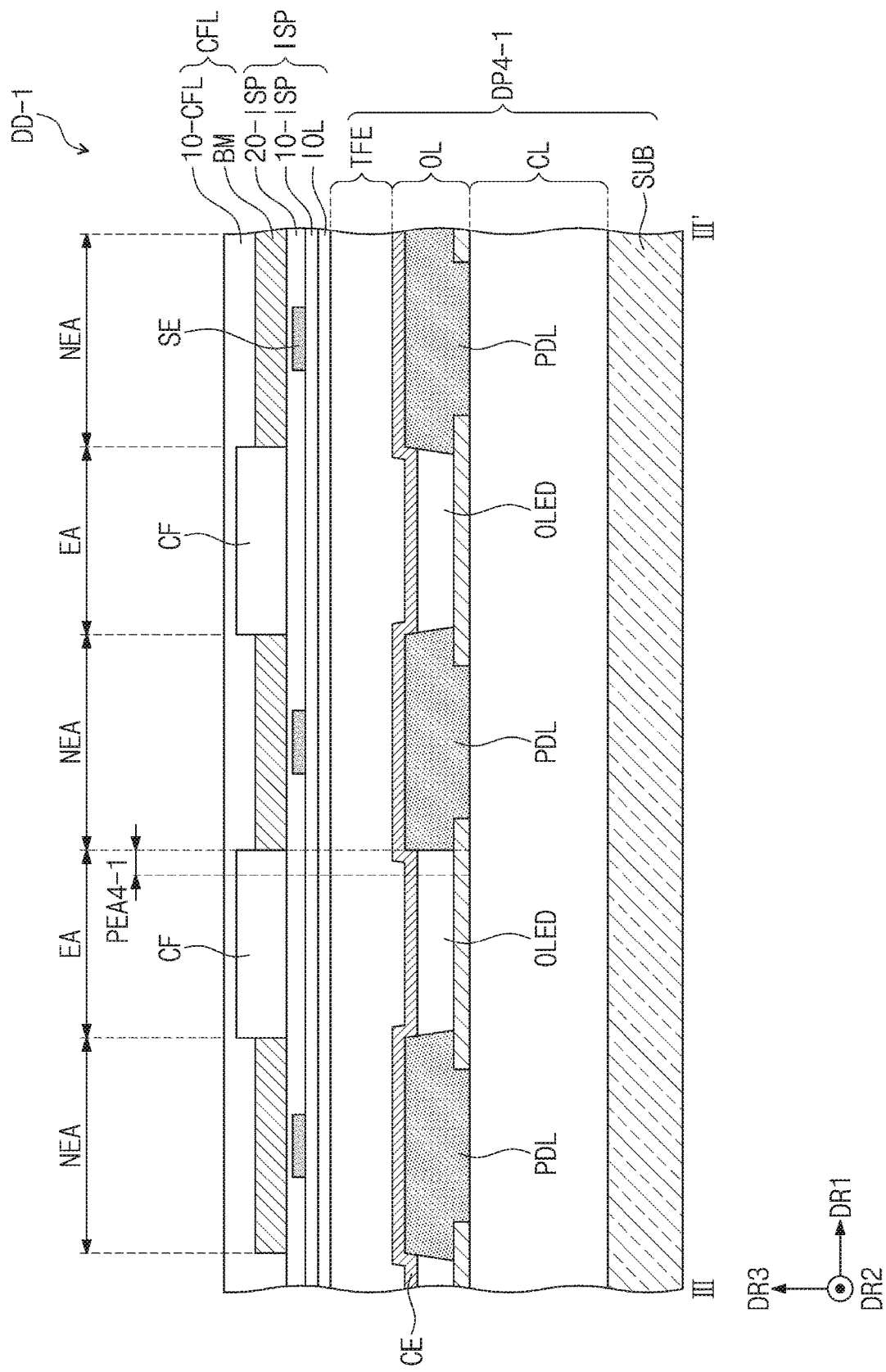

FIGS. 19B to 19D are views illustrating display panels of the display device DD according to an embodiment. The display panel DP-1 shown in FIG. 19A may have a structure of any one of display panels DP2-1 to DP4-1 shown in FIGS. 19B to 19D or any combination thereof.

Referring to FIG. 19B, the display panel DP2-1 includes second electrode CE2-1, and a portion of the second electrode CE2-1 that overlaps the transmission area PEA2-1 may be removed. A hole CE2-1H may be defined in the second electrode CE2-1. The hole CE2-1H may penetrates through the second electrode CE2-1 in the third direction DR3. The second electrode CE2-1 may be filled with an organic or inorganic layer of the thin film encapsulation layer TFE.

The second electrode CE2-1 that is not disposed in the transmission area PEA2-1 may increase the light transmittance of the transmission area PEA2-1 compared to the transmission area PEA-1 shown in FIG. 19A.

Referring to FIG. 19C, a display panel DP3-1 include a circuit element layer CL3-1, and the circuit element layer CL3-1 may have the same layer structure as the circuit element layer CL shown in FIG. 4.

A hole CL3-1H may be defined in the circuit element layer CL3-1 of the display panel DP3-1. The hole CL3-1H may penetrate through the circuit element layer CL3-1. In other words, the hole CL3-1H may be defined in each of the layers of the circuit element layer CL3-1.

The hole CL3-1H may overlap the transmission area PEA3-1. More specifically, the hole CL3-1H may overlap the first hole H1-1. In FIG. 19C, it is shown that the hole CL3-1H has the same width as the first hole H1-1, but this is only an example, and the width of the hole CL3-1H of the circuit element layer CL3-1 is not limited thereto. For example, when viewed from a plane, the hole CL3-1H may have the same width as the transmission area PEA3-1.

Due to the hole CL3-1H defined in the circuit element layer CL3-1, the transmission area PEA3-1 of the display panel DP3-1 may have a higher light transmittance than the transmission area PEA-1 shown in FIG. 19A.

Referring to FIG. 19D, the display panel DP4-1 may not include the first optical layer OPL1-1 shown in FIG. 19A. In this case, the display device DD-1 may include only the second optical layer OPL2 shown in FIG. 4. External light passing through the transmission area PEA4-1 may pass through the second optical layer OPL2 to reach the sensor SS.

Due to the omission of the first optical layer OPL1-1, the display panel DP4-1 may be thinner than the display panel DP-1 shown in FIG. 19A.

Figure 20:
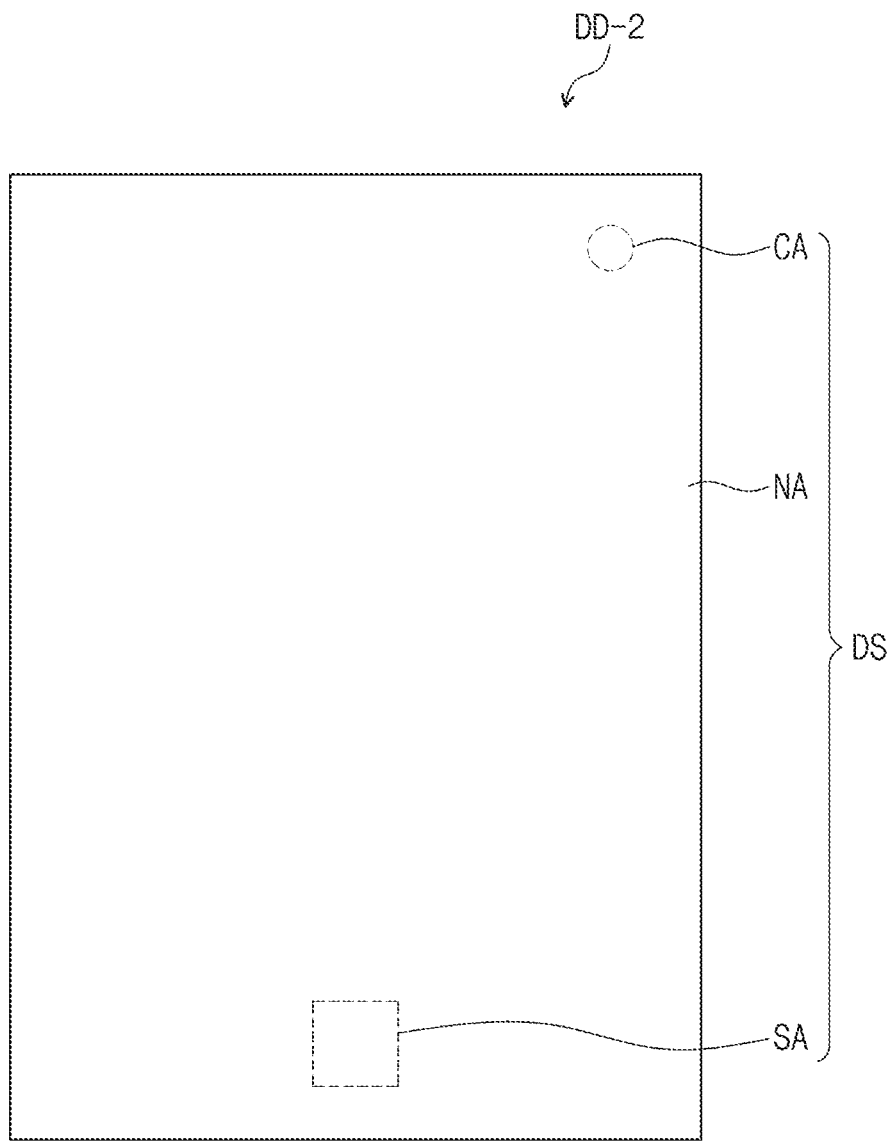
FIG. 20 is a plan view illustrating a display device according to an embodiment.
Figure 21:
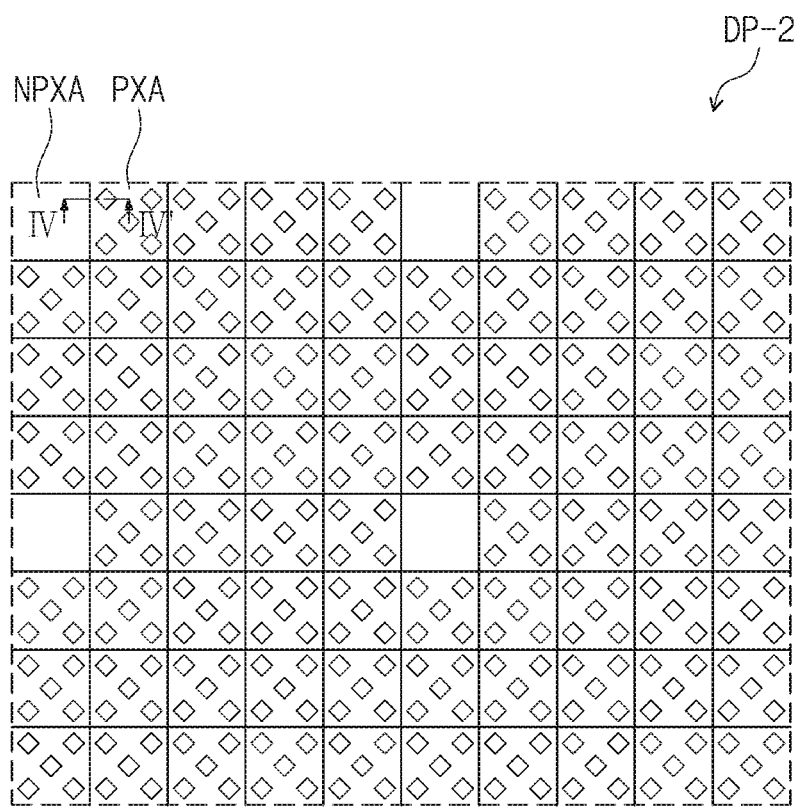
FIG. 21 is a plan view illustrating a portion of a detection area shown in FIG. 20.
Figure 22:
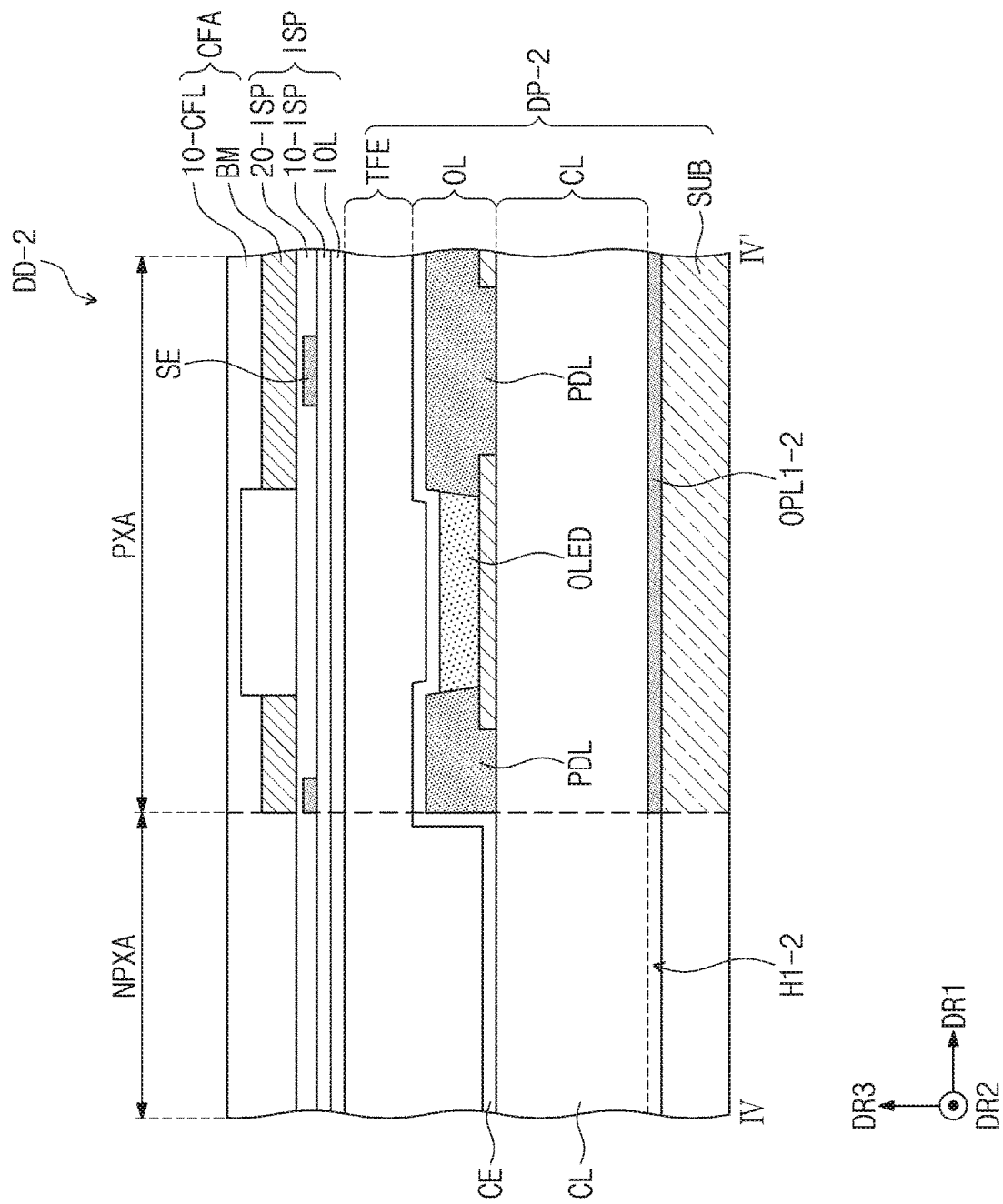
FIG. 22 is a cross-sectional view taken along the line IV-IV' shown in FIG. 21.
Figure 23:
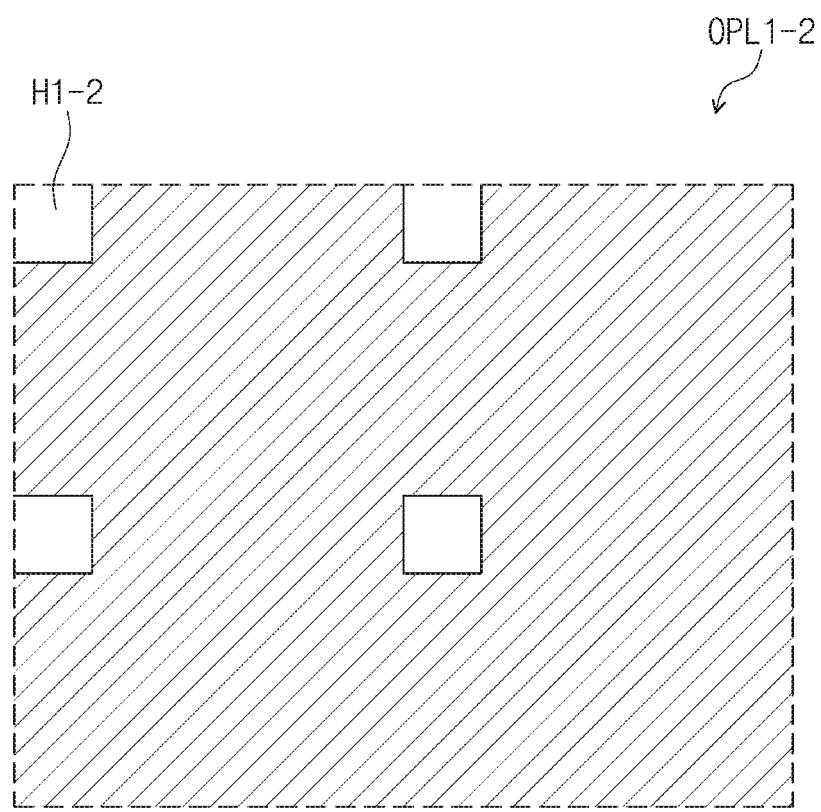
FIG. 23 is a plan view illustrating a first optical layer shown in FIG. 22.

FIG. 20 is a plan view illustrating a display device according to an embodiment. FIG. 21 is a plan view illustrating a portion of a detection area shown in FIG. 20. FIG. 22 is a cross-sectional view taken along the line IV-IV' shown in FIG. 21. FIG. 23 is a plan view illustrating a first optical layer shown in FIG. 22.

Referring to FIG. 20, a display device DD-2 may include the display surface DS including a normal area NA, a camera area CA, and a detection area SA. The display surface DS may correspond to the front surface of the display device DD-2. The normal area NA may include a display area (e.g., the display area DA of FIG. 1) displaying an image and a non-display area (e.g., the non-display area NDA of FIG. 1) arranged around the display area.

The camera area CA may correspond to a portion of the non-display area that does not display an image. For example, when viewed from a plane, the camera area CA may include a camera hole having a circular shape. The camera hole may be surrounded by the normal area NA. The camera area CA may include a camera module. The camera module may capture an image using light incident through the camera hole.

However, the camera area CA is not necessarily limited to the non-display area. For example, the camera area CA may display an image. However, in this case, the camera area CA may have a lower display resolution than the normal area NA to secure light transmittance for capturing an image.

The detection area SA may correspond to an area for recognizing biometric authentication information of a user. For example, the detection area SA may recognize a user's fingerprint information. The detection area SA may include the second optical layer OPL2 and the sensor SS shown in FIG. 7. The sensor SS may include an optical fingerprint sensor. The optical fingerprint sensor may optically detect the user's fingerprint information. For stable operation of the fingerprint sensor, the detection area SA may have a higher light transmittance than the normal area NA.

Referring to FIG. 21, the detection area SA may include a pixel area PXA and a non-pixel area NPXA. Here, the pixel area PXA may correspond to emission areas emitting light, and the non-pixel area NPXA may correspond to an area that does not emit light.

When viewed from a plane, the pixel area PXA in the detection area SA may be larger than the area of the non-pixel area NPXA. For example, based on a unit area of the detection area SA, the pixel area PXA may occupy 19/20 of the detection area SA, and the non-pixel area NPXA may occupy 1/20 of the detection area SA. For example, the unit area may be 1 in$^2$ (square inch).

However, the ratio between the pixel area PXA and the non-pixel area NPXA in the unit area is not limited to the above. For example, the ratio of the non-pixel area NPXA may increase or decrease according to the display quality (e.g., resolution) of the detection area SA.

Referring to FIGS. 22 and 23, a display panel DP-2 includes a first optical layer OPL1-2. External light may reach under the display panel DP-2 through the non-pixel area NPXA. Although not shown in the drawing, an optical fingerprint sensor may be disposed under a portion of the substrate SUB that overlaps the non-pixel area NPXA.

A first hole H1-2 may be defined in the first optical layer OPL1-2. The first hole H1-2 may overlap the non-pixel area NPXA. When viewed from a plane, the first hole H1-2 may have a shape corresponding to the non-pixel area NPXA illustrated in FIG. 21. For example, when viewed from a plane, the first hole H1-2 may have a rectangular shape. The shape and number of the first holes H1-2 defined in the first optical layer OPL1-2 may vary according to the shape and ratio of the non-pixel area NPXA.

The light emitting element OLED of the display element layer OL and the pixel defining layer PDL may be disposed in the pixel area PXA. In some embodiments, the pixel defining layer PDL of the display element layer OL may not be disposed in the non-pixel area NPXA. In addition, other layers of the light emitting element OLED other than the second electrode CE may not be disposed in the non-pixel area NPXA. The second electrode CE disposed in the non-pixel area NPXA may be removed in some embodiments.

The detection electrode SE of the input detection part ISP may be disposed in the pixel area PXA. In some embodiments, the detection electrode SE may not be disposed in the non-pixel area NPXA. The insulating layer IOL of the input detection part ISP and the first and second insulating layers 10-ISP and 20-ISP may be disposed in the non-pixel area NPXA.

The color filter CF of the color filter layer CFL and the black matrix BM may be disposed in the pixel area PXA. In some embodiments, the color filter CF and the black matrix BM may not be disposed in the non-pixel area NPXA. The insulating layer 10-CFL of the color filter layer CFL may be disposed in the non-pixel area NPXA.

The non-pixel area NPXA may have optically transparent properties. Accordingly, external light may reach the fingerprint sensor disposed under the substrate SUB through the non-pixel area NPXA.

According to an embodiment, the display device disclosed herein may recognize authentication information such as a user's fingerprint information through the first area. The first area may be referred to as a fingerprint detection area. A second hole overlapping the first area may be defined in the pixel defining layer, and a first hole overlapping the second hole may be defined in an optical layer.

Although some embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A display device comprising:
a sensor configured to detect a user's biometric information;
a display panel including a substrate disposed on the sensor, a pixel defining layer disposed on the substrate, and a light emitting element disposed in an opening of the pixel defining layer, wherein the display panel has a transmission area that overlaps the sensor when viewed from a plane;
an optical layer comprising a first hole that overlaps the transmission area; and
a spacer disposed in a second hole defined in the pixel defining layer and overlapping the first hole in a plan view, including a transparent material, and being disposed higher than the pixel defining layer.

2. The display device of claim 1, wherein the optical layer comprises a first optical layer disposed in the display panel, and
wherein the first optical layer includes the first hole that overlaps the transmission area.

3. The display device of claim 2, wherein the first optical layer is disposed between the substrate and the pixel defining layer.

4. The display device of claim 3, wherein the pixel defining layer has a black color.

5. The display device of claim 3, wherein, when viewed from the plane, the second hole has a second area that is larger than a first area of the first hole.

6. The display device of claim 1, wherein the light emitting element comprises a second electrode, and
wherein the second electrode of the light emitting element comprises a third hole that overlaps the transmission area.

7. The display device of claim 1, wherein the display panel further comprises a circuit element layer disposed between the substrate and the pixel defining layer, and
wherein the circuit element layer comprises a fourth hole that overlaps the transmission area.

8. The display device of claim 1, wherein the optical layer further comprises a second optical layer that is disposed between the display panel and the sensor, and
wherein the second optical layer comprises a lens that is convex upwardly.

9. The display device of claim 8, further comprising an adhesive layer disposed between the display panel and the second optical layer,
wherein the adhesive layer has a first refractive index that is lower than a second refractive index of the second optical layer.

10. The display device of claim 8, wherein the second optical layer comprises a light blocking layer that is disposed under the lens, and
wherein the light blocking layer comprises a transmission hole that overlaps the transmission area.

11. The display device of claim 8, wherein the second optical layer further comprises:
a transmission layer disposed under the lens; and
a light blocking coating layer disposed on a lower surface of the transmission layer, and
wherein the light blocking coating layer comprises a fifth hole that overlaps the transmission area.

12. The display device of claim 1, further comprising an input detection part that includes a plurality of detection electrodes disposed on the pixel defining layer,
wherein portions of the plurality of detection electrodes that overlap the transmission area are removed.

13. The display device of claim 1, further comprising a color filter layer disposed on the display panel.

14. The display device of claim 13, wherein the color filter layer comprises:
a first color filter overlapping the light emitting element;
a black matrix overlapping the pixel defining layer; and
a second color filter overlapping the transmission area.

15. The display device of claim 14, wherein the second color filter comprises a green color filter.

16. The display device of claim 14, wherein the second color filter extends from the first color filter.

17. The display device of claim 1, wherein the transmission area is provided in plurality.

18. A display device comprising:
a sensor configured to detect a user's biometric information;
a display panel including a substrate disposed on the sensor, a pixel defining layer disposed on the substrate, and a light emitting element disposed in an opening of the pixel defining layer, wherein the light emitting element has a transmission area;
an optical layer comprising a first hole that overlaps the transmission area of the light emitting element when viewed from a plane; and
a spacer disposed in a second hole defined in the pixel defining layer and overlapping the first hole in a plan view, including a transparent material, and being disposed higher than the pixel defining layer.

19. A display device comprising:
a display panel including a fingerprint detection area and a camera area;
a fingerprint sensor disposed under the fingerprint detection area of the display panel;
a camera disposed under the camera area of the display panel; and
an optical layer overlapping the fingerprint detection area, wherein the fingerprint detection area comprises a pixel area in which a plurality of pixels are disposed and a non-pixel area that has a light transmittance higher than that of the pixel area, and each of the pixels include a pixel defining layer in which an opening is formed, a light emitting element disposed in the opening, and a spacer disposed in a second hole defined in the pixel defining layer and overlapping the first hole in a plan view, including a transparent material, and being disposed higher than the pixel defining layer, wherein the fingerprint detection area includes the transmission area, wherein the optical layer has a first hole that overlaps the transmission area, and wherein the second hole overlaps the first hole.

* * * * *